US007813164B2

(12) United States Patent
Sugibayashi et al.

(10) Patent No.: US 7,813,164 B2
(45) Date of Patent: Oct. 12, 2010

(54) MAGNETO RESISTANCE ELEMENT AND MAGNETIC RANDOM ACCESS MEMORY

(75) Inventors: Tadahiko Sugibayashi, Tokyo (JP); Takeshi Honda, Tokyo (JP); Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 678 days.

(21) Appl. No.: 11/661,205

(22) PCT Filed: Aug. 26, 2005

(86) PCT No.: PCT/JP2005/015516

§ 371 (c)(1), (2), (4) Date: Oct. 3, 2007

(87) PCT Pub. No.: WO2006/022367

PCT Pub. Date: Mar. 2, 2006

(65) Prior Publication Data
US 2008/0094880 A1 Apr. 24, 2008

(30) Foreign Application Priority Data
Aug. 26, 2004 (JP) .............................. 2004-247473

(51) Int. Cl.
*G11C 11/00* (2006.01)
(52) U.S. Cl. ........................ 365/158; 365/171; 365/173; 365/214
(58) Field of Classification Search .................. 365/158, 365/171, 189.16, 173, 209, 225.5, 243.5, 365/214
See application file for complete search history.

(56) References Cited

U.S. PATENT DOCUMENTS

| 6,545,906 | B1 | 4/2003 | Savtchenko et al. | |
|---|---|---|---|---|
| 7,064,974 | B2* | 6/2006 | Suzuki et al. | 365/158 |
| 2004/0047190 | A1* | 3/2004 | Odagawa et al. | 365/200 |
| 2004/0085807 | A1* | 5/2004 | Hiramoto et al. | 365/145 |
| 2004/0145850 | A1* | 7/2004 | Fukumoto et al. | 361/143 |

FOREIGN PATENT DOCUMENTS

| JP | 2002-151758 A | 5/2002 |
|---|---|---|
| JP | 2004-39757 A | 2/2004 |
| JP | 2004-87870 A | 3/2004 |
| JP | 2004-128237 A | 4/2004 |
| JP | 2005-294376 A | 10/2005 |
| WO | WO 2005/098953 A1 | 10/2005 |

* cited by examiner

*Primary Examiner*—Tuan T Nguyen
*Assistant Examiner*—Toan Le
(74) *Attorney, Agent, or Firm*—Sughrue Mion, PLLC

(57) ABSTRACT

A magneto-resistance element includes a free layer, a fixed layer and a non-magnetic layer interposed between the free layer and the fixed layer. The free layer has a first magnetic layer, a second magnetic layer, a third magnetic layer, a first non-magnetic layer interposed between the first magnetic layer and the second magnetic layer, and a second non-magnetic layer interposed between the second magnetic layer and the third magnetic layer. The first magnetic layer, the second magnetic layer and the third magnetic layer are coupled such that spontaneous magnetizations have a helical structure.

19 Claims, 17 Drawing Sheets

Fig. 18A　Fig. 18B　Fig. 18C
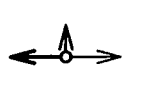  
  

MAGNETO RESISTANCE ELEMENT AND MAGNETIC RANDOM ACCESS MEMORY

This application claims priority from PCT Application No. PCT/JP2005/015516 filed Aug. 26, 2005, and from Japanese Patent Application No. 2004-247473 filed Aug. 26, 2004, which applications are incorporated herein by reference.

TECHNICAL FIELD

The present invention relates to a magneto-resistance element and a magnetic random access memory, particularly to a tunnel magneto-resistance element and a magnetic random access memory using the same.

BACKGROUND ART

There is known a magnetic random access memory (to be referred to as an MRAM, hereinafter) which stores data by controlling a magnetization direction of a memory cell. There are several kinds of MRAMs depending on a method for storing the magnetization direction.

In U.S. Pat. No. 6,545,906, a technique of a toggle type magnetic random access memory (to be referred to as a toggle MRAM, hereinafter) is disclosed. The toggle MRAM is a tunnel magneto-resistance element using a stacked ferric structure in a free layer of a memory element thereof. The MRAM has excellent selectivity of the memory cell at the time of a write operation, in which almost no multiple write is caused. The toggle MRAM disclosed in U.S. Pat. No. 6,545,906 will be described below.

FIG. 1 is a cross-sectional view showing a structure of a conventional toggle MRAM. A magneto-resistance element 105 in a memory cell 110 of this MRAM has an anti-ferromagnetic layer 104, a stacked ferric fixed layer 103, a tunnel insulating layer 102, and a stacked ferric free layer 101 which are laminated in this order. The stacked ferric fixed layer 103 has a stacked ferric structure, and includes a ferromagnetic layer 116, a non-magnetic layer 115, and a ferromagnetic layer 114. The stacked ferric free layer 101 has a stacked ferric structure, and includes a ferromagnetic layer 113, a non-magnetic layer 112, and a ferromagnetic layer 111. The magneto-resistance element 105 is put between a write word line 126 and a bit line 127 that are substantially orthogonal to each other.

The stacked ferric fixed layer 103 is formed as the stacked ferric structure to prevent leakage of a magnetic field from the stacked ferric fixed layer 103. A magnetization direction of the stacked ferric fixed layer 103 is fixed by the anti-ferromagnetic layer 104. The stacked ferric free layer 101 is also formed as the stacked ferric structure. The magnetic field is not leaked from the stacked ferric fixed layer 103 and the stacked ferric free layer 101 as long as no external magnetic field is applied.

FIG. 2 is a top view showing the structure of a conventional toggle MRAM. A plurality of write word lines 126 and a plurality of bit lines 127 are arranged to be orthogonal to each other (respective ones are shown in FIG. 2), and the magneto-resistance element 105 is arranged in each of intersections of them. The magneto-resistance element 105 has an easily magnetized direction (magnetization easy axis) which is directed at substantially 45 degrees (θ) relative to the word line 26 and the bit line 27. It is due to consideration for easiness of a toggle operation.

Next, a principle of a write operation in the conventional toggle MRAM shown in FIG. 1 will be described. In the toggle MRAM, data can be written only from "1" to "0" or from "0" to "1". That is, it is impossible to overwrite data of "1" to "1" and "0" to "0". Therefore, the write operation of the toggle MRAM is performed by reading data from a selected memory cell in advance and determining whether or not a magnetization direction should be changed or whether or not toggle operation is performed in first and second free layers on the basis of the read data and data to be written. That is, if the read data ("0" or "1") is equal to the data to be written ("0" or "1"), the toggle operation is not performed, while the toggle operation is performed if a read data is different from the data to be written.

FIGS. 3A to 3H are diagrams showing a principle of the toggle operation in the toggle MRAM of a conventional technique as shown in FIG. 1. FIG. 3A is a timing chart of a write current $I_{BL}$ flowing through the bit line 127. FIG. 3B is a timing chart of a write current $I_{WL}$ flowing through the word line 126. FIG. 3C is a time change of a magnetization direction 121s of the ferromagnetic layer 113 and a magnetization direction 122s of the ferromagnetic layer 111 in a selected cell as the memory cell 110 into which data should be written. FIG. 3D shows a time change in a direction of a magnetic field generated by the write current $I_{BL}$ and the write current $I_{WL}$. FIG. 3E shows a time change in a magnetization direction 121a of the ferromagnetic layer 113 and a magnetization direction 122a of the ferromagnetic layer 111 in each of non-selected cells connected to the same bit line 127 as the selected cell. FIG. 3F is a time change in a direction of the magnetic field generated by the write current $I_{BL}$. FIG. 3G shows a time change in a magnetization direction 121b of the ferromagnetic layer 113 and a magnetization direction 122b of the ferromagnetic layer 111 in each of the non-selected cells connected to the same word line 126 as the selected cell. FIG. 3H shows a time change in a direction of the magnetic field generated by the write current $I_{WL}$.

Referring to FIG. 3A, the write current $I_{BL}$ is provided for the bit line 127 at time t2 in the toggle operation. The write current $I_{WL}$ is provided for the word line 126 at time t3. The write current $I_{BL}$ is suspended at time t4. The write current IWL is suspended at time t5. Due to a series of the above current controls, a rotational magnetic field such as a magnetic field 123 to a magnetic field 124 to a magnetic field 125 as shown in FIG. 3D is added to the selected cell in a cross point between the selected word line 126 provided with the write current $I_{WL}$, and the selected bit line 127 provided with the write current $I_{BL}$. Therefore, the magnetization direction 121s of the ferromagnetic layer 113 and the magnetization direction 122s of the ferromagnetic layer 111 in the selected cell are rotated or changed as shown in FIG. 3C, so that data can be written. That is, data can be rewritten into a state of "1" if initial data has a state of "0", and to a state of "0" if the initial data has a state of "1".

At this time, a unidirectional magnetic field such as the magnetic field 123 as shown in FIG. 3F is exclusively added to the non-selected cell connected to the same bit line 127 as the selected cell. Therefore, the magnetization direction 121a of the ferromagnetic layer 113 and the magnetization direction 122a of the ferromagnetic layer 111 in the non-selected cell are returned to an original state with some fluctuations as shown in FIG. 3E, so that data is not written. Similarly, a unidirectional magnetic field such as the magnetic field 125 as shown in FIG. 3H is exclusively added to the non-selected cell connected to the same word line 126 as the selected cell. Therefore, the magnetization direction 121b of the ferromagnetic layer 113 and the magnetization direction 122b of the ferromagnetic layer 111 in the non-selected cell are returned to the original state with some fluctuations as shown in FIG. 3G, so that data is not written.

In case of the toggle MRAM, it is impossible to freely write "1" and "0", so that data needs to be read once at the time of a write cycle, followed by being written thereafter. There is a demand for a technique to sort "1" and "0" to write while eliminating a multiple write.

FIG. 4 is a diagram showing a magnetic field applied to the magneto-resistance element in the selected cell. The magneto-resistance element 5 is inclined to a Y axis by θ. Therefore, magnetic fields HX (magnetic substance) and HY (magnetic substance) of the magneto-resistance element in the magnetization hard axial direction and a magnetization easy axial direction are inclined to the magnetic fields HX (wiring) and HY (wiring) of the wirings in an X axial direction and a Y axial direction by θ. It indicates a saturated magnetic field which is a maximum magnetic field to allow an anti-ferromagnetic coupling to be held between the ferromagnetic layer 113 and the ferromagnetic layer 111. A flop magnetic field is a minimum magnetic field required to reverse a magnetization direction of the stacked ferric free layer 101. An arrow indicates a route of a magnetic field applied to the selected cell.

In case of the toggle MRAM, composite magnetization of the stacked ferric free layer 101 approaches saturation in accordance with the increase of an applied magnetic field. In this case, there is a possibility of switching between magnetization of the ferromagnetic layer 111 in an upper layer and magnetization of the ferromagnetic layer 113 in a lower layer in the stacked ferric free layer 101 due to thermal disturbance. There is a demand for a technique which uses a write magnetic field to prevent composite magnetization from approaching saturation and to suppress a possibility of switching between magnetization of the ferromagnetic layer in an upper layer and magnetization of the ferromagnetic layer in a lower layer due to the thermal disturbance.

As a related technique, Japanese Laid Open Patent Application (JP-P2004-128237A) discloses a technique of a magneto-resistance effect element and a magnetic memory device. The magneto-resistance effect element includes a laminate structure which includes a free layer with the reversible magnetization direction, a fixed layer with a non-reversed magnetization direction, and an insulating film held therebetween. The fixed layer has a stacked ferric structure in which a first magnetic layer and a second magnetic layer are stacked via an intermediate non-magnetic layer, and a saturated magnetization of a material to form the first magnetic layer positioned on the insulating layer side is smaller than a saturated magnetization of a material to form the second magnetic layer.

Also, Japanese Laid Open Patent Application (JP-P2004-87870A) discloses a technique of a magneto-resistance effect element and a magnetic memory device. The magneto-resistance effect element includes a laminate structure which includes at least two ferromagnetic layers and an insulating layer held between the ferromagnetic layers. One of the ferromagnetic layers has a function as the free layer with a reversible magnetization direction, while the remaining ferromagnetic layer has a function as the fixed layer with a non-reversed magnetization direction. The free layer has a magnetic field application member to apply a magnetostatic field to the free layer.

Moreover, Japanese Laid Open Patent Application (JP-P2004-39757A) discloses a technique of a magneto-resistance effect element and a magnetic memory device. The magneto-resistance effect element has a pair of ferromagnetic layers to be mutually opposed via an intermediate layer, and is configured to obtain a magneto-resistance change by causing a current to flow perpendicularly to a film surface. One of the ferromagnetic layers is a magnetization fixed layer, and the remaining ferromagnetic layer is a magnetization free layer. The magnetization free layer is composed of a ferromagnetic material having an absolute value of a magnetostriction constant which is equal to or less than 1.5 ppm.

Furthermore, Japanese Laid Open Patent Application (JP-P2002-151758A) discloses a technique of a ferromagnetic tunnel magneto-resistance effect element, a magnetic memory, and a magneto-resistance effect type head. The ferromagnetic tunnel magneto-resistance effect element has a tunnel barrier layer which is formed between the first magnetic layer and a multi-layer structure of laminating at least five layers including a ferromagnetic layer and an intermediate layer. The first magnetic layer has a magnetization direction restricted to an external magnetic field. The ferromagnetic layer to compose the multi-layer structure has a magnetization direction rotated to an external magnetic field, in which the magnetization is anti-ferromagnetically arranged via the intermediate layer. The ferromagnetic tunnel magneto-resistance effect element has a ferromagnetic tunnel magneto-resistance effect film having resistance changed by a relative angle of the magnetization of the first ferromagnetic layer and the ferromagnetic layers to compose the multi-layer structure, lower and upper electrodes to be electrically connected to lower and upper magnetic layers in order to provide a sense current for the ferromagnetic tunnel magneto-resistance effect film, and a detection section adapted to detect a resistance change.

DISCLOSURE OF INVENTION

Therefore, an object of the present invention is to provide a magneto-resistance element and a magnetic random access memory, in which "1" and "0" can be freely written while eliminating a multiple write.

Another object of the present invention is to provide a magneto-resistance element and a magnetic random access memory, in which write magnetic field allows to prevent the composite magnetization from approaching saturation, and to suppress a possibility of switching between magnetization of a ferromagnetic layer in an upper layer and magnetization of a ferromagnetic layer in a lower layer due to the thermal disturbance.

Yet another object of the present invention is to provide a magneto-resistance element and a magnetic random access memory that are inexpensive and have a high performance, high reliability and high yields.

In a first aspect of the present invention, a magneto-resistance element includes a free layer, a fixed layer and a non-magnetic layer interposed between the free layer and the fixed layer. The free layer has a first magnetic layer, a second magnetic layer, a third magnetic layer, a first non-magnetic layer interposed between the first magnetic layer and the second magnetic layer, and a second non-magnetic layer interposed between the second magnetic layer and the third magnetic layer. The first magnetic layer, the second magnetic layer and the third magnetic layer are coupled such that spontaneous magnetizations have a helical structure.

Here, it is preferable that an angle between a first direction of spontaneous magnetization in the first magnetic layer and a second direction of spontaneous magnetization in the second magnetic layer is substantially a right angle, and an angle between the first direction and a third direction of spontaneous magnetization in the third magnetic layer is substantially two right angles.

Also, a first coupling between the first magnetic layer and the second magnetic layer and a second coupling between the second magnetic layer and the third magnetic layer are competitive with a third coupling between the first magnetic layer and the third magnetic layer. Moreover, the first coupling and the second coupling are an anti-ferromagnetic coupling through the non-magnetic layer, and the third coupling is the anti-ferromagnetic coupling by magnetostatic energy.

Furthermore, the first non-magnetic layer and the second non-magnetic layer are coupled on a side surface of the second magnetic layer to form a third non-magnetic layer, in which the first coupling and the second coupling are an anti-ferromagnetic coupling by the non-magnetic layers, and the third coupling is also the anti-ferromagnetic coupling by the non-magnetic layer.

Also, the free layer has small anisotropy energy of a magnetization moment in the second magnetic layer in comparison with anisotropy energy of a magnetization moment in the first magnetic layer and anisotropy energy of a magnetization moment in the third magnetic layer.

As another aspect of the present invention, a magnetic random access memory includes a plurality of first wirings extending in a first direction, a plurality of second wirings extending in a second direction which is substantially orthogonal to the first direction, and a plurality of memory cells arranged at intersections of the plurality of first wirings and the plurality of second wirings. Each of the plurality of memory cells has a magneto-resistance element, and the magneto-resistance element includes a free layer, a fixed layer, and a non-magnetic layer interposed between the free layer and the fixed layer. The free layer has a first magnetic layer, a second magnetic layer, a third magnetic layer, a first non-magnetic layer interposed between the first magnetic layer and the second magnetic layer, and a second non-magnetic layer interposed between the second magnetic layer and the third magnetic layer. The first magnetic layer, the second magnetic layer, and the third magnetic layer are coupled to have a helical structure in the spontaneous magnetization, and the magneto-resistance element has a magnetization easy axial whose direction is different from the first direction and the second direction.

Here, it is preferable that an angle between the magnetization easy axial direction and the first direction is substantially 45 degrees.

In a selected cell as the memory cell at an intersection of one selected from the plurality of first wirings and one selected from the plurality of second wirings, a write operation may be performed by supplying a first write current to a first current wiring as one of the selected first wiring and the selected second wiring based on memory data to be written, and then supplying a second write current to a second current wiring as the remaining wiring, next by stopping the first write current and then stopping the second write current. Alternatively, the write operation may be performed by supplying the first write current to the first current wiring as one of the selected bit line and the selected word line selected based on memory data to be written, and then supplying a second write current to a second current wiring as the remaining line, and next by stopping the first write current and then stopping the second write current.

In still another aspect of the present invention, a magnetic random access memory includes a first wiring extending in a first direction, a second wiring extending in a second direction which is substantially orthogonal to the first wiring, a memory cell provided between the first wiring and the second wiring at an intersection of the first wiring and the second wiring to have a magneto-resistance element, and a current supply unit configured to supply currents to the first wiring and the second wiring respectively. The magneto-resistance element includes a free layer, a fixed layer, and a non-magnetic layer interposed between the free layer and the fixed layer. The free layer has a first magnetic layer, a second magnetic layer, a third magnetic layer, a first non-magnetic layer interposed between the first magnetic layer and the second magnetic layer, and a second non-magnetic layer interposed between the second magnetic layer and the third magnetic layer. The first magnetic layer, the second magnetic layer, and the third magnetic layer are coupled to have a helical structure in spontaneous magnetization. The current supply unit starts to supply a first current to one of the first wiring and the second wiring in accordance with data to be written in the memory cell, and starts to supply a second current to the remaining wiring of the first wiring and the second wiring while the first current is being provided, next stops the first current while the second current is being provided, and then stops the second current after the first current is stopped.

Here, it is preferable that the magneto-resistance element has a magnetization easy axis whose direction is different from the first direction and the second direction, and an angle between the magnetization easy axis direction and the first direction is substantially 45 degrees.

It is preferable that an angle between the first direction of the spontaneous magnetization of the first magnetic layer and a second direction of a spontaneous magnetization in the second magnetic layer is substantially a right angle, and an angle between the first direction and a third direction of the spontaneous magnetization of the third magnetic layer is substantially two right angles.

A first coupling between the first magnetic layer and the second magnetic layer and a second coupling between the second magnetic layer and the third magnetic layer are competitive with a third coupling between the first magnetic layer and the third magnetic layer. The first coupling and the second coupling are anti-ferromagnetic coupling through the non-magnetic layers, and the third coupling is the anti-ferromagnetic coupling by magneto-static energy.

Also, the first non-magnetic layer and the second non-magnetic layer are coupled in a side surface of the second magnetic layer to form the third non-magnetic layer, in which the first coupling and the second coupling are the anti-ferromagnetic coupling by the non-magnetic layers, and the third coupling is also the anti-ferromagnetic coupling by the non-magnetic layer.

Moreover, the free layer has small anisotropy energy of the magnetization moment in the second magnetic layer in comparison with anisotropy energy of the magnetization moment in the first magnetic layer and anisotropy energy of the magnetization moment in the third magnetic layer.

In yet still another aspect of the present invention, the magnetic random access memory includes a first wiring extending in a first direction, a second wiring extending in a second direction which is substantially orthogonal to the first wiring, the memory cell disposed between the first wiring and the second wiring at an intersection of the first wiring and the second wiring and including a magneto-resistance element, and a magnetic field application unit for applying a rotational magnetic field to the memory cell by supplying currents to the first wiring and the second wiring. The magneto-resistance element has a free layer, a fixed layer and a non-magnetic layer interposed between the fixed layer and the free layer, in which the free layer is provided with a first magnetic layer having a spontaneous magnetization in the third direction, a second magnetic layer having a spontaneous magnetization in a direction orthogonal to the third direction and magnetically coupled with the first magnetic layer, and a third magnetic layer having a spontaneous magnetization in a direction opposite to the third direction and magnetically coupled with the first and second magnetic layers. The magnetic field application unit applies one of a magnetic field rotated in a clockwise direction and a magnetic field rotated in a counterclockwise direction to the memory cell in accordance with data to be written into the memory cell.

Here, it is preferable that the magneto-resistance element has a magnetization easy axis whose direction is different from the first direction and the second direction, and an angle between the magnetization easy axial direction and the first direction is substantially 45 degrees.

BRIEF DESCRIPTION OF DRAWINGS

FIGS. 18A to 18C are a diagrams to explain a relationship between a magnetization direction and energy among a first layer, a second layer and a third layer.

BEST MODE FOR CARRYING OUT THE INVENTION

Hereinafter, a magneto-resistance element and a magnetic random access memory according to the present invention will be described in detail with reference to the attached drawings.

Figure 1:
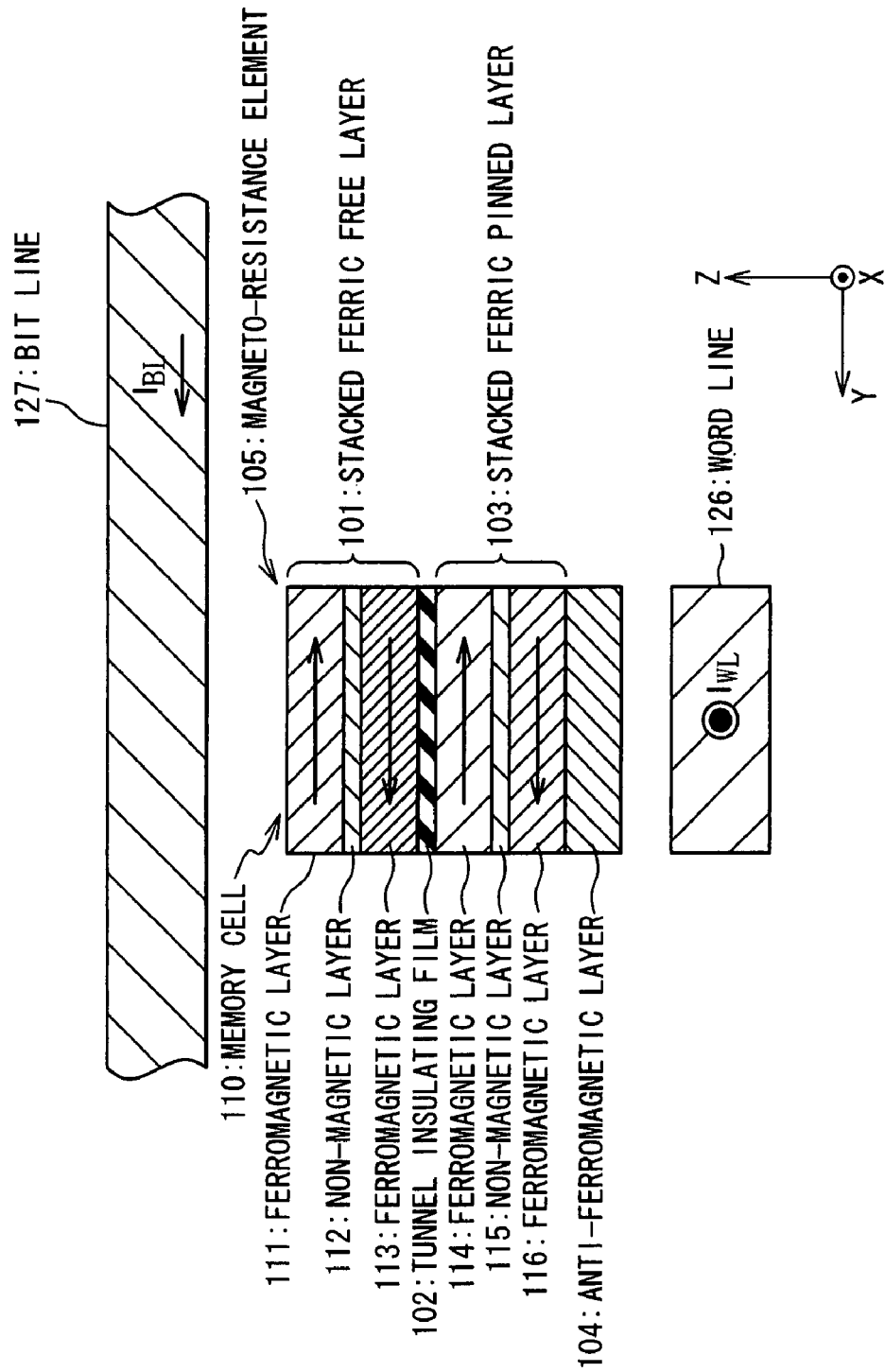
FIG. 1 is a cross-sectional view showing a structure of a conventional toggle MRAM.
Figure 2:
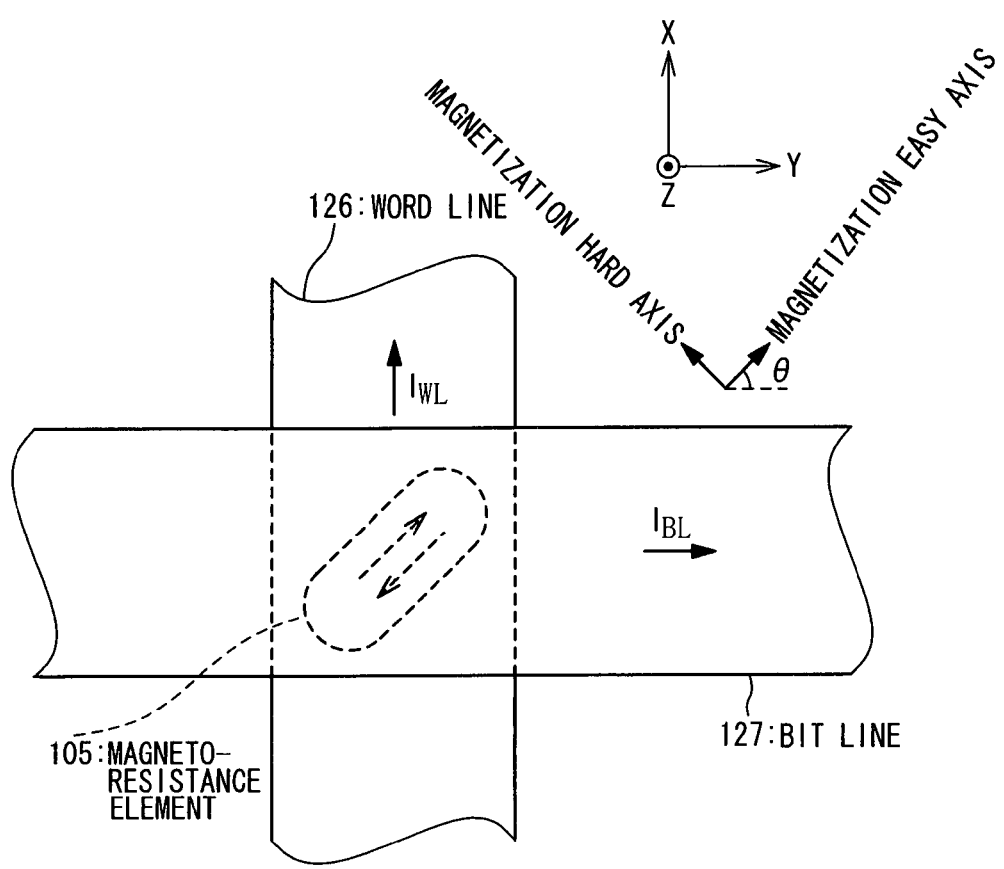
FIG. 2 is a plan view showing the structure of the conventional toggle MRAM.
Figure 3:
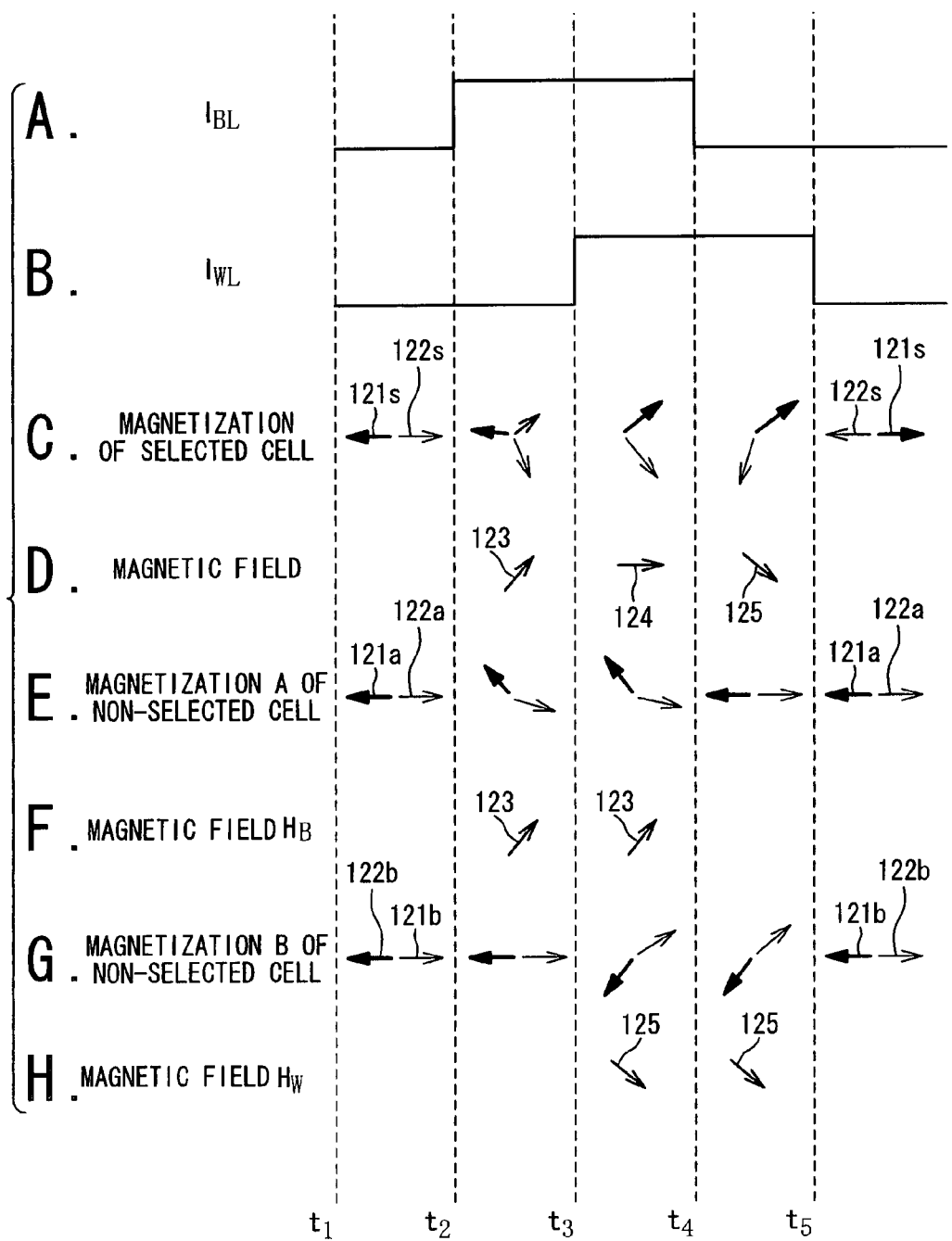
FIGS. 3A to 3H are diagrams showing a principle of toggle operations in the toggle MRAM of a conventional technique.
Figure 4:
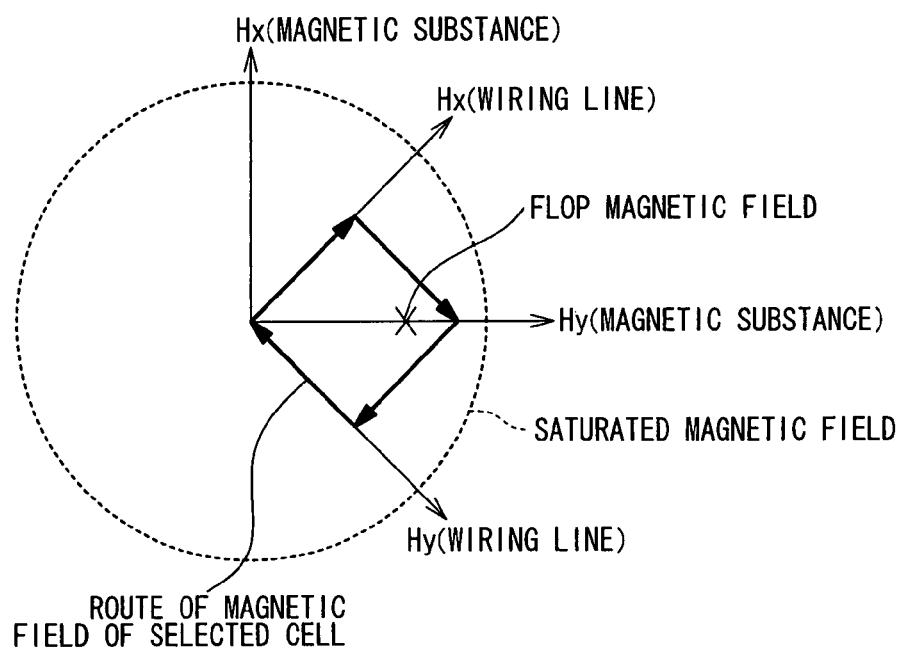
FIG. 4 is a graph showing a magnetic field applied to a magneto-resistance element in a selected cell.
Figure 5:
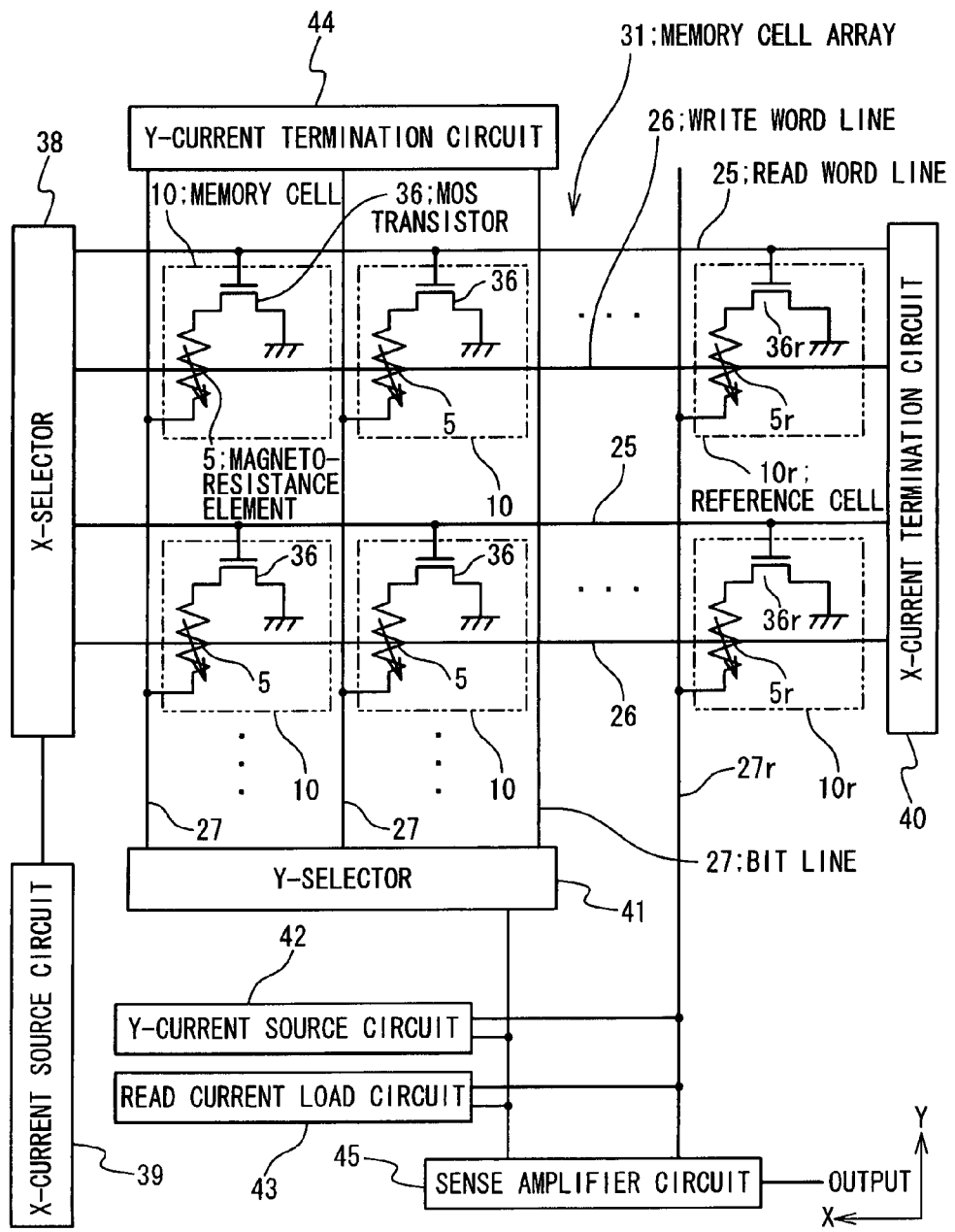
FIG. 5 is a block diagram showing a configuration of an embodiment of an MRAM according to the present invention.

At first, the configuration of the magnetic random access memory to which the magneto-resistance element is applied according to an embodiment of the present invention will be described. FIG. 5 is a block diagram showing the configuration of the magnetic random access memory (MRAM) according to the embodiment of the present invention. The MRAM includes a memory cell array 31, a plurality of write word lines 26, a plurality of read word lines 25, a plurality of bit lines 27, an X-side selector 38, an X-side current source circuit 39, an X-side termination circuit 40, a Y-side selector 41, a Y-side current source circuit 42, a read current load circuit 43, a Y-side current termination circuit 44, and a sense amplifier 45.

The memory cell array 31 has a plurality of memory cells 10 that are arranged in a matrix. The X-side selector 38 selects a desirably selected read word line 25s at the time of the read operation and selects a desirably selected write word line 26s at the time of the write operation from the plurality of the read word lines 25 and the plurality of the write word lines 26 that extend in the X axial direction. The X-side current source circuit 39 supplies a constant current at the time of the write operation. The X-side current source termination circuit 40 terminates the plurality of the write word lines 26. The Y-side selector 41 selects a desirably selected bit line 27s from the plurality of the bit lines 27 extending in the Y axial direction. The read current load circuit 43 supplies a predetermined current to a selected memory cell (selected cell 10s) and a memory cell 10r (reference cell). The Y-side current termination circuit 44 terminates the plurality of the bit lines 27. The sense amplifier 45 outputs data of the selected cell 10s on the basis of the difference between a voltage of a reference bit line 27r connected to the reference cell 10r, and a voltage of the bit line 27 connected to the selected cell 10s.

Each of the memory cells 10 is arranged at one of intersections of the read word line 25, the write word line 26 and the bit line 27. The memory cell 10 includes an MOS transistor 36 connected to the read word line 25, and a magneto-resistance element 5 that are connected in series. Since the magneto-resistance element 5 has an effective resistance value which is changed depending on "1" and "0" of data (R and R+ΔR), it is indicated as a variable resistor.

Data is read from the memory cell 10 as follows. A suffix s means to be selected.

A constant current is supplied from the read current load circuit 43 to the magneto-resistance element 5 of the selected cell 10s arranged at an intersection of the selected read word line 25s selected by the X-side selector 38 and the selected bit line 27s selected by the Y-side selector. The selected bit line 27s is therefore set to a voltage corresponding to a state of the stacked ferric free layer 111 of the magneto-resistance element 5. Meanwhile, a constant current is also supplied to the reference cell 10r selected by the bit line 27r and the selected read word line 25s similarly. The bit line 27r is thus set to a predetermined reference voltage. The sense amplifier 115 determines data of the selected cell 10s by comparing the magnitudes of the both voltages. For example, if a voltage of the selected bit line 27s is larger than a reference voltage, data is determined as "1", and data is determined as "0" if it is smaller.

Figure 6:
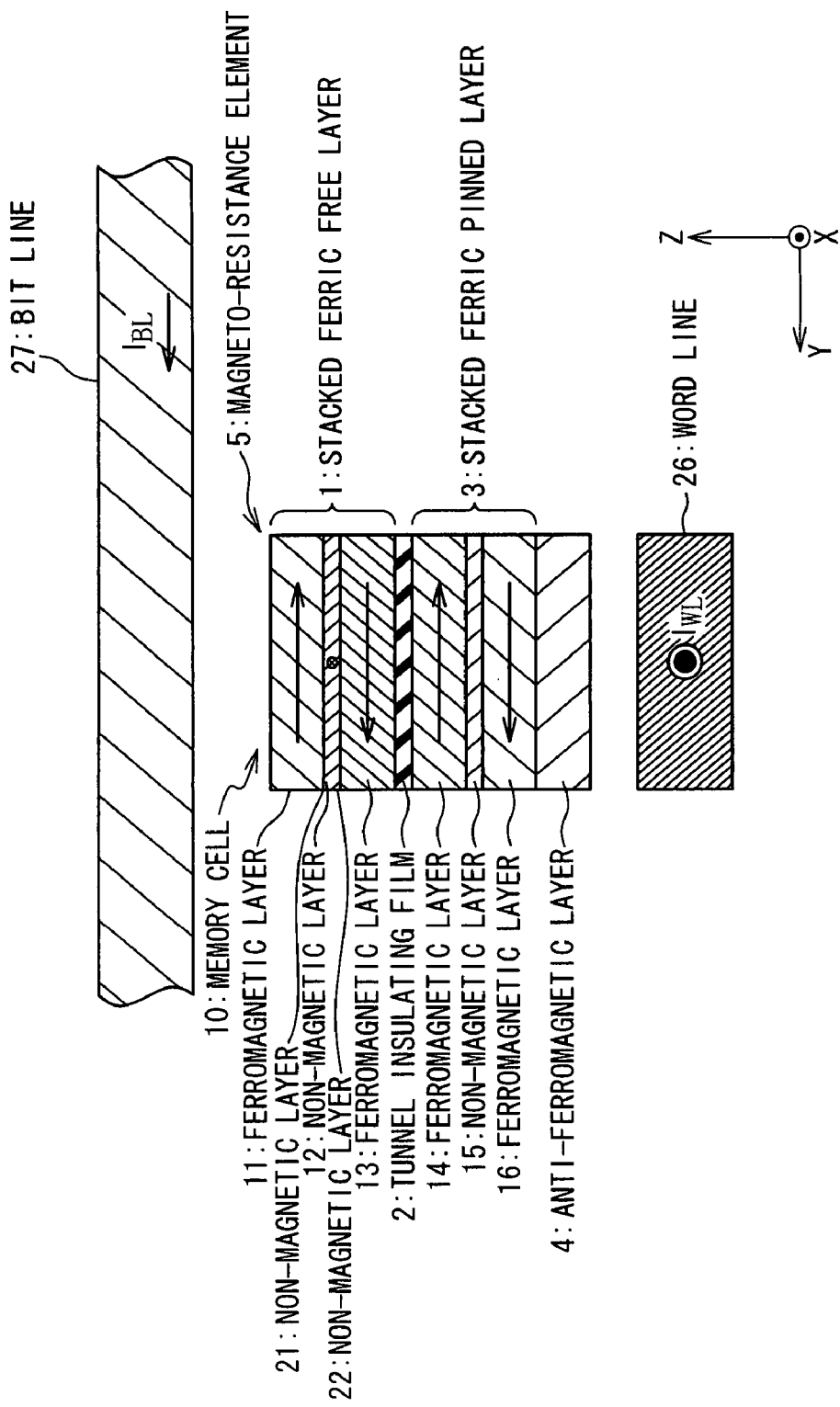
FIG. 6 is a cross-sectional view of the MRAM in FIG. 1 in the vicinity of a memory cell.

FIG. 6 is a cross-sectional view of the MRAM in FIG. 5 in the vicinity of the memory cell. The magneto-resistance element 5 of the memory cell 10 has a structure in which an anti-ferromagnetic layer 4, a stacked ferric fixed layer 3, a tunnel insulating layer 2, and a stacked ferric free layer 1 are stacked in this order. The stacked ferric fixed layer 3 has a stacked ferric structure, and includes a structure in which a ferromagnetic layer 16, a non-magnetic layer 15, and a ferromagnetic layer 14 are stacked in this order. The stacked ferric free layer 1 has a stacked ferric structure, and includes a structure in which a ferromagnetic layer 13, a non-magnetic layer 22, a ferromagnetic layer 12, a non-magnetic layer 21, and a ferromagnetic layer 11 are stacked in this order. The magneto-resistance element 5 is arranged between the write word line 26 and the bit line 27 that are substantially orthogonal to each other via an interlayer insulating layer (not shown).

Figure 7:
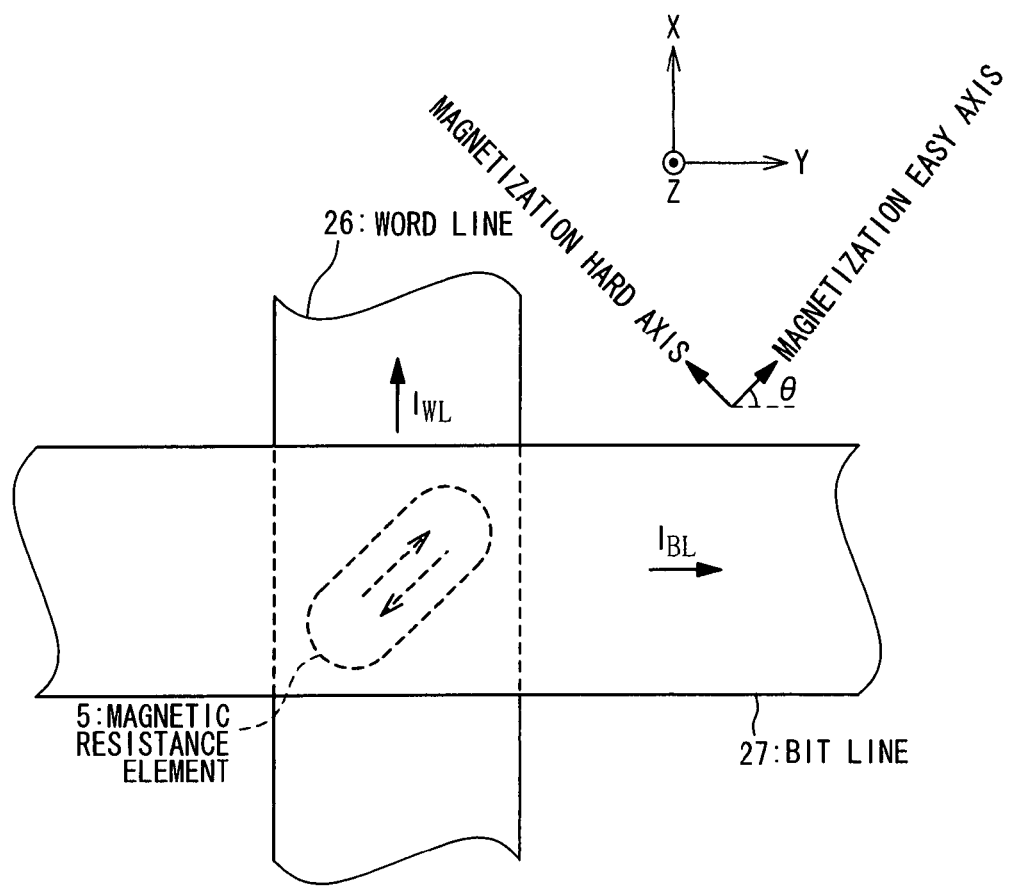
FIG. 7 is a plan view showing a structure of a toggle MRAM according to the present invention.

FIG. 7 is a plan view showing a structure of the MRAM according to the present invention. The magneto-resistance element 5 has a magnetization easy axis which is directed at substantially 45 degrees (θ) relative to the word line 26 and the bit line 27. It is due to consideration for easiness of the toggle operation.

Figure 8:
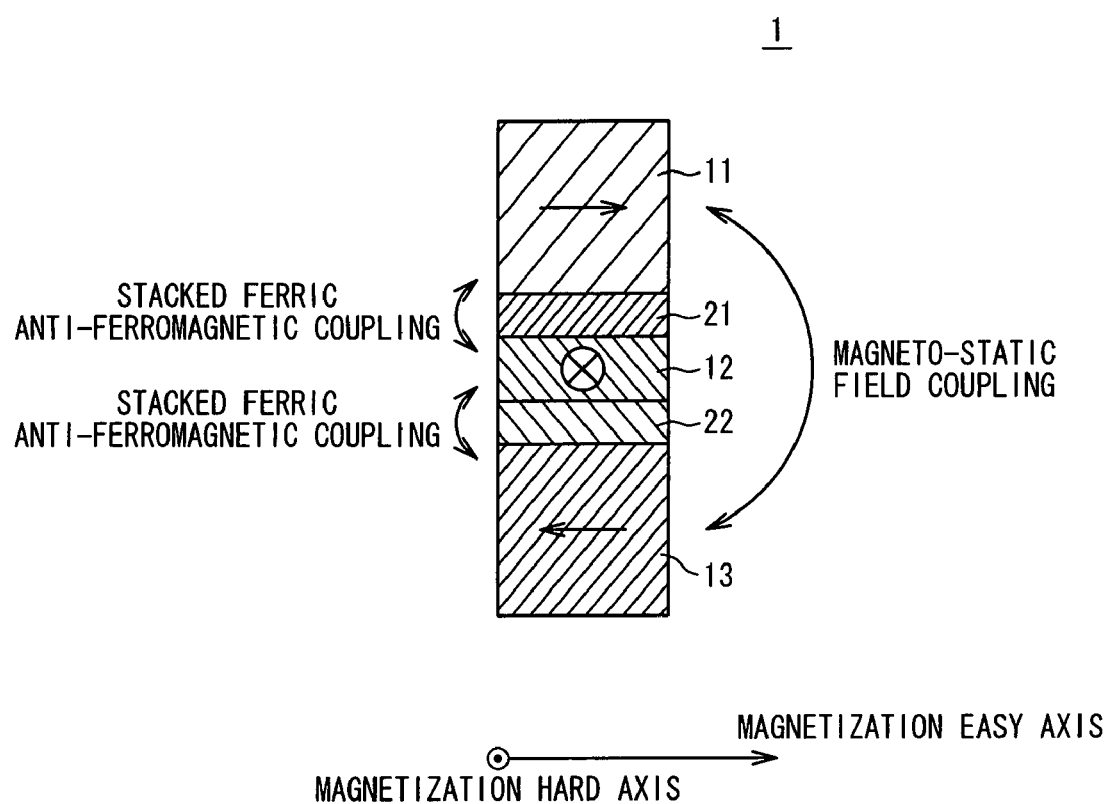
FIG. 8 is a cross-sectional view of a stacked ferric free layer 1 of the memory cell in FIG. 6.

FIG. 8 is a cross-sectional view of the stacked ferric free layer 1 of the memory cell in FIG. 6. The stacked ferric free layer 1 is a stacked ferrimagnetic structure. The stacked ferrimagnetic structure includes the three ferromagnetic layers 11, 12 and 13, and includes the non-magnetic layer 21 between the ferromagnetic layer 11 and the ferromagnetic layer 12, and the non-magnetic layer 22 between the ferromagnetic layer 12 and the ferromagnetic layer 13. A film thickness of the non-magnetic layer 21 is determined so as to anti-ferromagnetically couple the ferromagnetic layer 11 and the ferromagnetic layer 12 through the non-magnetic layer 21. Similarly, a film thickness of the non-magnetic layer 22 is determined so as to anti-ferromagnetically couple the ferromagnetic layer 12 and the ferromagnetic layer 13 through the non-magnetic layer 22.

If energy of the anti-ferromagnetic coupling and anisotropy energy of a magnetization moment of the ferromagnetic layer 12 are small in comparison with anisotropy energy of the ferromagnetic layer 11 and anisotropy energy of the ferromagnetic layer 13, magnetization directions of the ferromagnetic layer 11 and the ferromagnetic layer 13 are directed to the magnetization easy axis. The ferromagnetic layer 11 and the ferromagnetic layer 13 are anti-ferromagnetically coupled or magnetostatically coupled to each other by magnetic fields generated from both of them. A magnetization direction of the ferromagnetic layer 12 is directed to a magnetization hard axis due to non-alignment with the magnetization directions of the ferromagnetic layer 11 and the ferromagnetic layer 13. That is, it could be understood that the helical structure is exhibited in a state of magnetization directions from a magnetization direction of the ferromagnetic layer 11 to a magnetization direction of the ferromagnetic layer 12 to a magnetization direction of the ferromagnetic layer 13 in which the magnetization directions are spirally changed.

An anti-ferromagnetic coupling (the first coupling) between the ferromagnetic layer 11 (a first layer) and the ferromagnetic layer 12 (a second layer) and an anti-ferromagnetic coupling (the second coupling) between the ferromagnetic layer 12 and the ferromagnetic layer 13 (a third layer) are stabilized when the magnetization directions are coupled in an antiparallel state. Therefore, a stable state is provided by directing the magnetization directions of the ferromagnetic layer 11 (the first layer) and the ferromagnetic layer 13 (the third layer) in the same direction. Meanwhile, a magneto-static coupling (the third coupling) between the ferromagnetic layer 11 (the first layer) and the ferromagnetic layer 13 (the third layer) is stabilized when the ferromagnetic layer 11 (the first layer) and the ferromagnetic layer 13 (the third layer) are coupled so as to have antiparallel magnetization directions. That is, each of the first coupling, the second coupling, and the third coupling is intended to realize a different state from each other, and the couplings are competitive from each other. Due to this competition, data can be sorted between "1" and "0" to write without performing the read operation in the toggle operation as will be described below.

Figure 9:
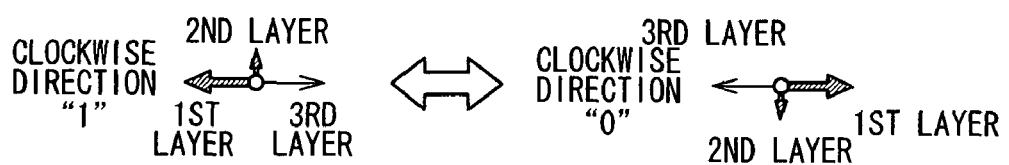
FIG. 9 is a conceptual diagram showing kinds of a stable state of the stacked ferric free layer having a helical structure.
Figure 10:
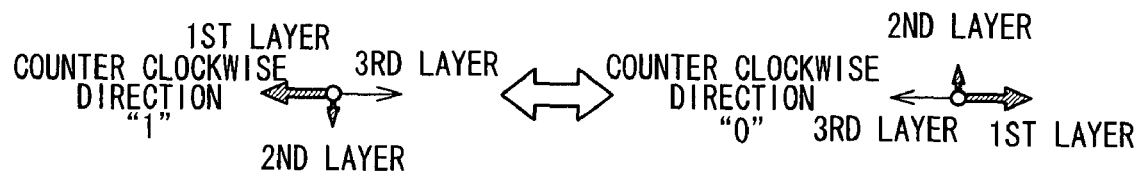
FIG. 10 is a conceptual diagram showing kinds of a stable state of the stacked ferric free layer having the helical structure.

FIGS. 9 and 10 are conceptual diagrams showing a stable state of the stacked ferric free layer having the helical structure. The magnetization direction in each of the layers in the three layers distinguishes data between "1" and "0". Here, the magnetization direction of the ferromagnetic layer 12 (the second layer) distinguishes data between the helical structure in a clockwise direction (clockwise direction system) and the helical structure in a counterclockwise direction (counterclockwise direction system). In case of the magnetic field of "0", the clockwise direction system and the counterclockwise direction system are the same in terms of energy. Two states in a mirror relationship are generally distinguished as chirality. FIG. 9 shows the clockwise direction system. FIG. 10 shows the counterclockwise type. A thick-width arrow indicates the magnetization direction of the ferromagnetic layer 11 (the first layer), a medium-width arrow indicates the magnetization direction of the ferromagnetic layer 12 (the second layer), and a thin-width arrow indicates the magnetization direction of the ferromagnetic layer 13 (the third layer), respectively.

Referring to FIG. 9, if a combination of magnetization directions shown on a left side of FIG. 9 is expressed as "1", the combination is rotated at 180 degrees in the clockwise direction so that a combination of magnetization directions shown in a right side of FIG. 9 is expressed as "0". The toggle operation is performed to allow constant rotation in the clockwise direction in the write operation.

Referring to FIG. 10, if a combination of magnetization directions shown on a left side of FIG. 9 is expressed as "1", the combination is rotated at 180 degrees in the counterclockwise direction so that a combination of magnetization directions shown on a right side of FIG. 9 is expressed as "0". The toggle operation is performed to allow constant rotation in the counterclockwise direction in the write operation.

Figure 11:
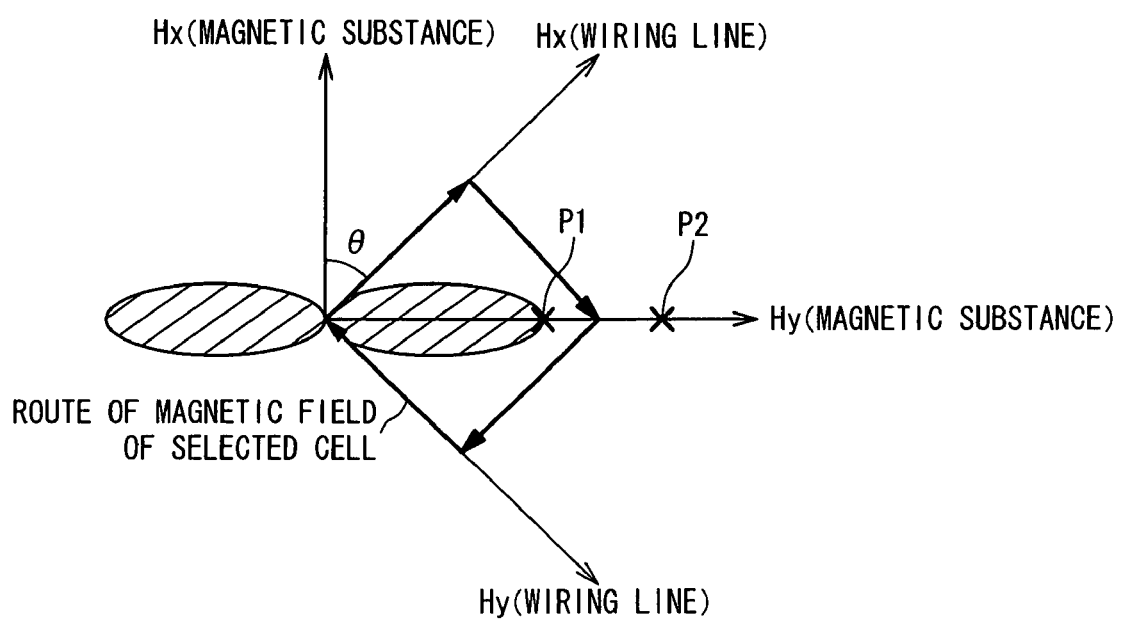
FIG. 11 is a graph showing a magnetic field applied to the magneto-resistance element in the selected cell.

FIG. 11 is a graph showing the magnetic field applied to the magneto-resistance element of the selected cell. The magneto-resistance element 5 is inclined to the Y axis by θ. Therefore, magnetic fields $H_x$ (magnetic substance) and $H_y$ (magnetic substance) of the magneto-resistance element 5 (stacked ferric free layer 1) in the magnetization hard axial direction and the magnetization easy axial direction are inclined to the magnetic fields $H_x$ (wiring) and $H_y$ (wiring) of the wirings (word line 26 and bit line 27) in the X axial direction and the Y axial direction by θ. An arrow indicates a route of the magnetic field applied to the selected cell.

Figure 12:
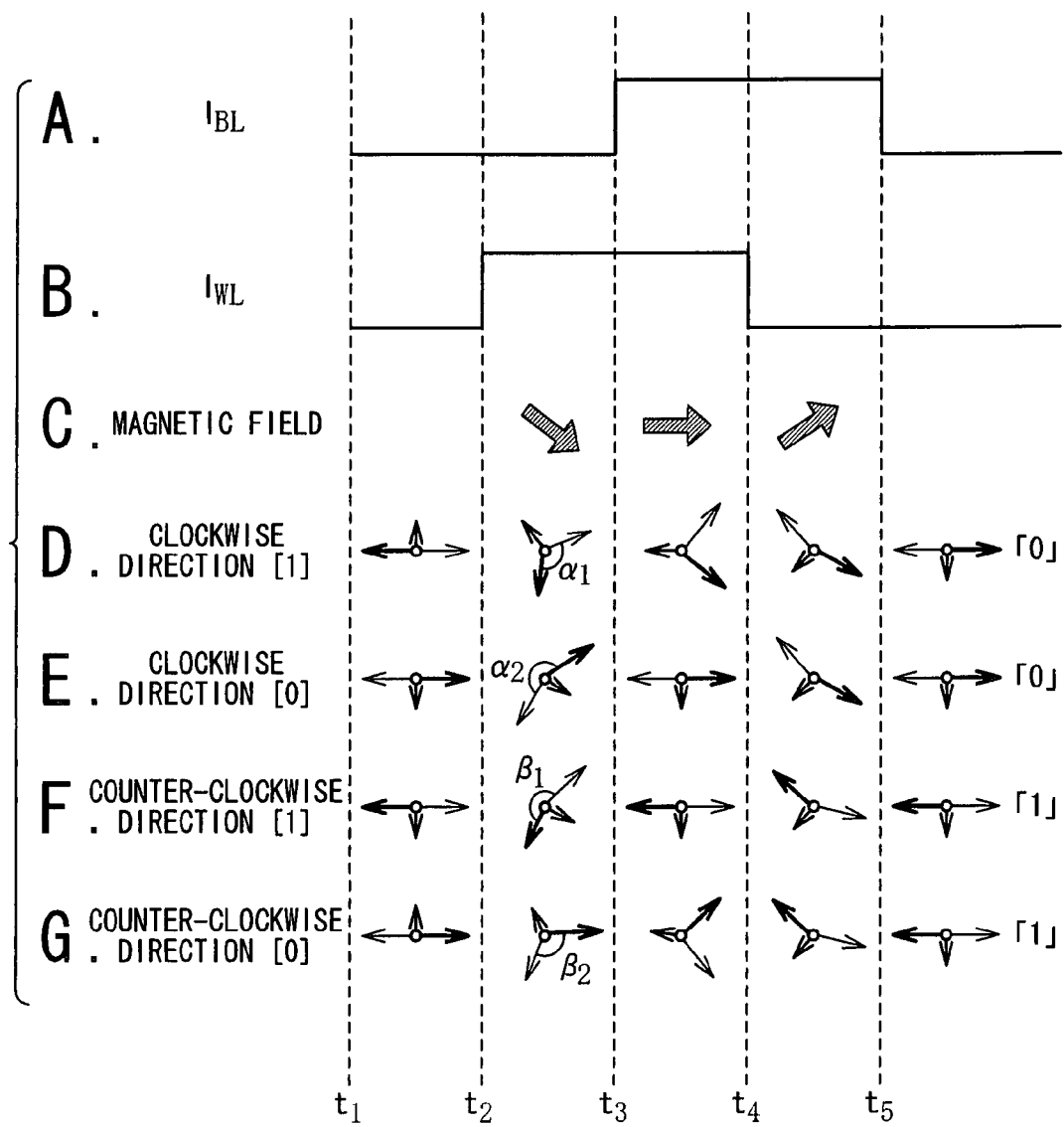
FIGS. 12A to 12G are diagrams showing a change in a magnetization direction of each of layers in the stacked ferric free layer at the time of a write operation to the magneto-resistance element.
Figure 13:
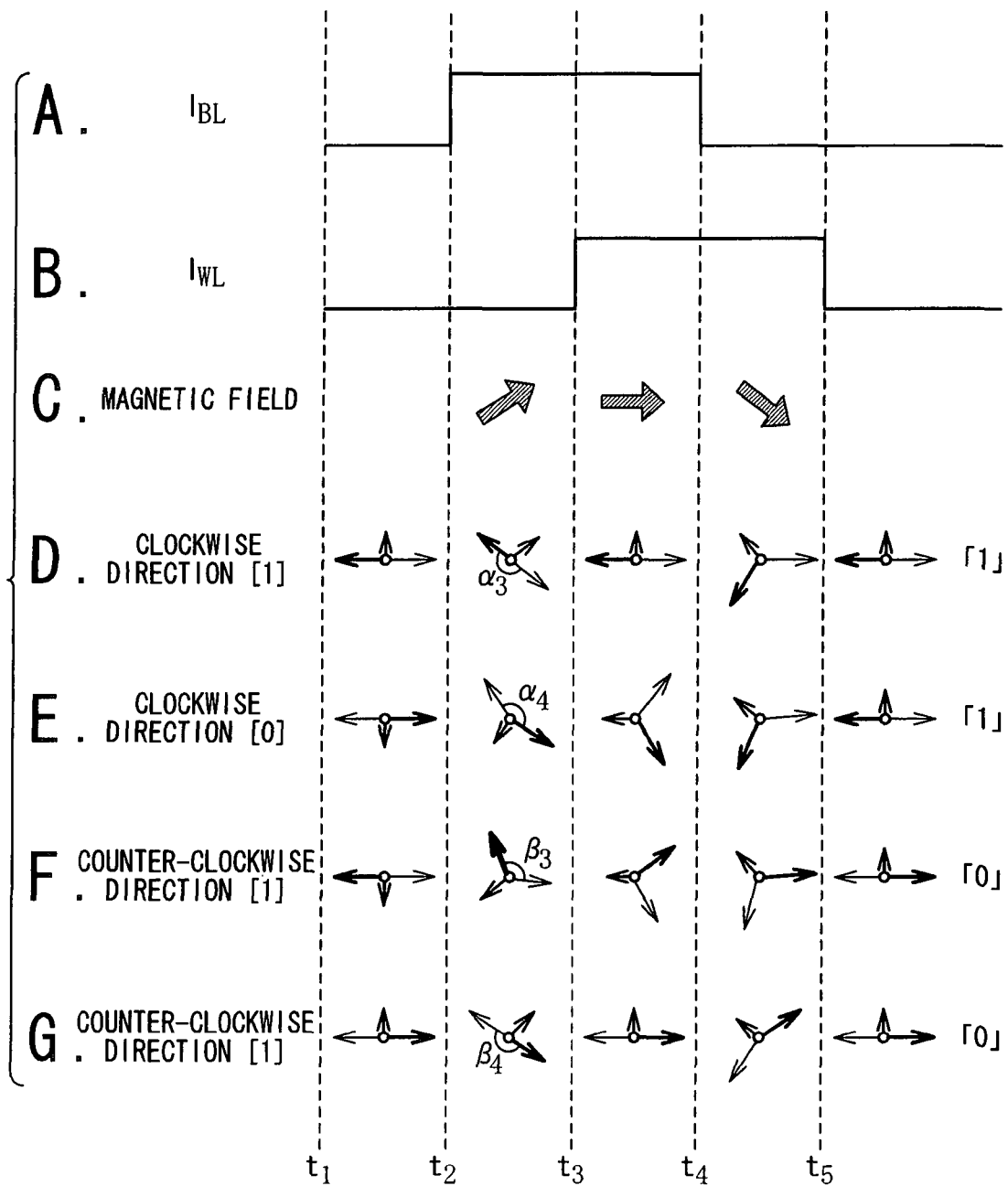
FIGS. 13A to 13G are diagrams showing a change in a magnetization direction of each of the layers in the stacked ferric free layer at the time of the write operation to the magneto-resistance element.

If the ferromagnetic layer 12 (the second layer) has small magnetization and small energy obtained by being directed to a magnetic field direction, the chirality is stored in spite of application of a magnetic field equal to or larger than the flop magnetic field. In this case, a flop magnetic field P1 in the clockwise direction system of "1" in which a magnetic field was changed in the clockwise direction (left side in FIG. 9)

has a different value from a flop magnetic field P2 in the clockwise direction system of "1" in which the magnetic field is changed in the counterclockwise direction. A state of dividing the flop magnetic field by values of "0" and "1" and the chirality as described above will be described in FIGS. 12 and 13.

FIGS. 12A to 12G are diagrams showing a change of a magnetization direction in each of the layers in the stacked ferric free layer at the time of the write operation to the magneto-resistance element. FIG. 12A is a timing chart of a write current $I_{BL}$ flowing through the bit line 27. FIG. 12B is a timing chart of a write current $I_{WL}$ flowing through the word line 26. FIG. 12C is a time change in a direction of the magnetic field generated by the write current $I_{BL}$ and the write current $I_{WL}$. FIG. 12D shows a change in the magnetization directions of the ferromagnetic layer 11 (the first layer) through the ferromagnetic layer 13 (the third layer) in case of storing "0" into the stacked ferric free layer of a clockwise direction system which has stored "1" (left side in FIG. 9). FIG. 12E shows a change in the magnetization directions of the ferromagnetic layer 11 (the first layer) through the ferromagnetic layer 13 (the third layer) in case of storing "0" into the stacked ferric free layer of the clockwise direction system which has stored "0" (right side in FIG. 9). FIG. 12F shows a change in the magnetization directions of the ferromagnetic layer 11 (the first layer) through the ferromagnetic layer 13 (the third layer) in case of storing "1" into the stacked ferric free layer of a counterclockwise direction system which has stored "1" (left side in FIG. 10). FIG. 12G shows a change in the magnetization directions of the ferromagnetic layer 11 (the first layer) through the ferromagnetic layer 13 (the third layer) in case of storing "1" into the stacked ferric free layer of the counterclockwise direction system which has stored "0" (right side in FIG. 10). In FIGS. 12D to 12G, a thick and long arrow indicates a magnetization direction of the first layer (ferromagnetic layer 11), a medium and short arrow indicates a magnetization direction of the second layer (ferromagnetic layer 12), and a thin and long arrow indicates a magnetization direction of the third layer (ferromagnetic layer 13). As shown in FIGS. 12A and 12B, a case in which the write current $I_{WL}$ is made to flow initially is shown.

Referring to FIG. 12D, when the magnetic field is applied in a direction at 45 degrees (in a lower direction in FIG. 12D) (time: t2 to t3), an angle between the second layer and the first layer and an angle between the second layer and the third layer are made wide in the clockwise direction system of "1". In a state that an angle α1 between the first layer and the third layer is made smaller to a certain extent (time: t3), a magnetization direction of the first layer exceeds the magnetization hard direction when the magnetic field is applied to the magnetization easy axis in a substantially parallel direction (time: t3 to t4). Furthermore, when the magnetic field is applied in a direction at 45 degrees (in an upper direction in of FIG. 12D) (time: t4 to t5), a magnetization direction of the third layer exceeds the magnetization hard direction. Therefore, magnetization of the stacked ferric free layer is rotated to provide a state of "0". That is, "0" is stored in the stacked ferric free layer of the clockwise direction system which had stored "1" (left side in FIG. 9).

Meanwhile, referring to FIG. 12E, when the magnetic field is applied in a direction at 45 degrees (in a lower direction of FIG. 12E) (time: t2 to t3), an angle between the second layer and the first layer and an angle between the second layer and the third layer are made smaller in the clockwise direction system of "0". In a state that the angle α2 between the first layer and the third layer is made larger to a certain extent (time: t3), magnetization directions of the first layer and the third layer are returned to substantially original states when the magnetic field is applied to the magnetization easy axis in a substantially parallel direction (time: t3 to t4). Furthermore, when the magnetic field is applied in a direction at 45 degrees (in an upper direction of FIG. 12E) (time: t4 to t5), the magnetization directions of the first layer and the third layer are slightly moved, but ultimately returned to an original state at a time point of losing the magnetic field (time: t5). Therefore, the magnetization of the stacked ferric free layer is not rotated to maintain the original state of "1". That is, "0" is stored in the stacked ferric free layer of the clockwise direction system which has stored "0" (right side in FIG. 9).

Referring to FIG. 12F, when the magnetic field is applied in a direction at 45 degrees (in a lower direction of FIG. 12F) (time: t2 to t3), an angle between the second layer and the first layer and an angle between the second layer and the third layer are made smaller in the counterclockwise direction system of "1". In a state that an angle β1 between the first layer and the third layer is made larger to a certain extent (time: t3), the magnetization directions of the first layer and the third layer are returned to substantially original states when the magnetic field is applied to the magnetization easy axis in a substantially parallel direction (time: t3 to t4). Furthermore, when the magnetic field is applied in a direction at 45 degrees (in an upper direction of FIG. 12F) (time: t4 to t5), the magnetization directions of the first layer and the third layer are slightly moved, but ultimately returned to original states at a time point of losing the magnetic field (time: t5). Therefore, the magnetization of the stacked ferric free layer 1 is not rotated to maintain the original state of "1". That is, "1" is stored in the stacked ferric free layer of the counterclockwise direction system which has stored "1" (left side in FIG. 10).

Meanwhile, referring to FIG. 12G, when the magnetic field is applied in a direction at 45 degrees (in a lower direction of FIG. 12G) (time: t2 to t3), an angle between the second layer and the first layer and an angle between the second layer and the third layer are made wide in the counterclockwise direction system of "0". In a state that an angle β2 between the first layer and the third layer is made smaller to a certain extent (time: t3), a magnetization direction of the third layer exceeds the magnetization hard axis when the magnetic field is applied to the magnetization easy axis in a substantially parallel direction (time: t3 to t4). Furthermore, when the magnetic field is applied in a direction at 45 degrees (in an upper direction of FIG. 12G) (time: t4 to t5), a magnetization direction of the first layer exceeds the magnetization hard axis. Therefore, the magnetization of the stacked ferric free layer 1 is rotated to provide a state of "1". That is, "1" is stored in the stacked ferric free layer of the counterclockwise direction system which has stored "0" (right side in FIG. 10).

FIGS. 13A to 13G are diagrams showing a change of a magnetization direction in each of the layers in the stacked ferric free layer at the time of the write operation to the magneto-resistance element. FIG. 13A is a timing chart of the write current $I_{BL}$ flowing through the bit line 27. FIG. 13B is a timing chart of the write current $I_{WL}$ flowing through the word line 26. FIG. 13C is a time change in a direction of the magnetic field generated by the write current $I_{BL}$ and the write current $I_{WL}$. FIG. 13D shows a change in the magnetization directions of the first layer through the third layer in case of storing "1" into the stacked ferric free layer of the clockwise direction system which has stored "1" (left side in FIG. 9). FIG. 13E shows a change in the magnetization directions of the first layer through the third layer in case of storing "1" into the stacked ferric free layer of the clockwise direction system which has stored "0" (right side in FIG. 9). FIG. 13F shows a change in the magnetization directions of the first layer through the third layer in case of storing "0" into the stacked ferric free layer of the counterclockwise direction system which has stored "1" (left side in FIG. 10). FIG. 13G shows a change in the magnetization directions of the first layer through the third layer in case of storing "0" into the stacked ferric free layer of the counterclockwise direction system which has stored "0" (right side in FIG. 10). In FIGS. 13D to 13G, a thick and long arrow indicates a magnetization direction of the first layer (ferromagnetic layer 11), a medium and short arrow indicates a magnetization direction of the second layer (ferromagnetic layer 12), and a thin and long arrow indicates a magnetization direction of the third layer (ferromagnetic layer 13). As shown in FIGS. 13A and 13B, a case in which the write current $I_{BL}$ is made to flow initially is shown.

Referring to FIG. 13D, when the magnetic field is applied in a direction at 45 degrees (in a upper direction of FIG. 13D) (time: t2 to t3), an angle between the second layer and the first layer and an angle between the second layer and the third layer are made smaller in the clockwise direction system of "1". In a state that an angle $\alpha 3$ between the first layer and the third layer is made larger to a certain extent (time: t3), the magnetization directions of the first layer and the third layer are returned to original states when the magnetic field is applied to the magnetization easy axis in a substantially parallel direction (time: t3 to t4). Furthermore, when the magnetic field is applied in a direction at 45 degrees (in a lower direction of FIG. 13D) (time: t4 to t5), a magnetization direction of the first layer is slightly moved, but ultimately returned to an original state at the time of losing the magnetic field (time: t5). Therefore, the magnetization of the stacked ferric free layer is not rotated to maintain the original state of "1". That is, "1" is stored in the stacked ferric free layer of the clockwise direction system which has stored "1" (left side in FIG. 9).

Meanwhile, referring to FIG. 13E, when the magnetic field is applied in a direction at 45 degrees (in an upper direction of FIG. 13E) (time: t2 to t3), an angle between the second layer and the first layer and an angle between the second layer and the third layer are made wide in the clockwise direction system of "0". In a state that an angle $\alpha 4$ between the first layer and the third layer is made smaller to a certain extent (time: t3), a magnetization direction of the third layer exceeds the magnetization hard axis when the magnetic field is applied to the magnetization easy axis in a substantially parallel direction (time: t3 to t4). Furthermore, when the magnetic field is applied in a direction at 45 degrees (in a lower direction of FIG. 13E) (time: t4 to t5), a magnetization direction of the first layer exceeds the magnetization hard axis. Therefore, the magnetization of the stacked ferric free layer is rotated to provide a state of "1". That is, "1" is stored in the stacked ferric free layer of the clockwise direction system which has stored "0" (right side in FIG. 9).

Referring to FIG. 13F, when the magnetic field is applied in a direction at 45 degrees (in an upper direction of FIG. 13F) (time: t2 to t3), an angle between the second layer and the first layer and an angle between the second layer and the third layer are made wide in the counterclockwise direction system of "1". In a state that an angle $\beta 3$ between the first layer and the third layer is made smaller to a certain extent (time: t3), a magnetization direction of the first layer exceeds the magnetization hard axis when the magnetic field is applied to the magnetization easy axis in a substantially parallel direction (time: t3 to t4). Furthermore, when the magnetic field is applied in a direction at 45 degrees (in a lower direction of FIG. 13F) (time: t4 to t5), a magnetization direction of the third layer exceeds the magnetization hard axis. Therefore, the magnetization of the stacked ferric free layer is rotated to provide a state of "0". That is, "0" is stored in the stacked ferric free layer of the counterclockwise direction system which has stored "1" (left side in FIG. 10).

Meanwhile, referring to FIG. 13G, when the magnetic field is applied in a direction at 45 degrees (in an upper direction of FIG. 13G) (time: t2 to t3), an angle between the second layer and the first layer and an angle between the second layer and the third layer are made smaller in the counterclockwise direction system of "0". In a state that an angle $\beta 4$ between the first layer and the third layer is made larger to a certain extent (time: t3), the magnetization directions of the first layer and the third layer are returned to original states when the magnetic field is applied to the magnetization easy axis in a substantially parallel direction (time: t3 to t4). Furthermore, when the magnetic field is applied in a direction at 45 degrees (in a lower direction of FIG. 13G) (time: t4 to t5), a magnetization direction of the third layer is slightly moved, but ultimately returned to the original state at a time point of losing the magnetic field (time: t5). Therefore, the magnetization of the stacked ferric free layer is not rotated to maintain the original state of "0". That is, "0" is stored in the stacked ferric free layer of the counterclockwise direction system which has stored "0" (right side in FIG. 10).

That is, when an attention is paid to the clockwise direction system, it could be understood from FIG. 12D, FIGS. 12E, 13D and 13E that "0" can be written by causing the write current $I_{WL}$ to flow initially and "1" can be written by causing the write current $I_{BL}$ to flow initially regardless of a state of "1" or "0" in the magneto-resistance element. Similarly, when an attention is paid to the counterclockwise direction system, it could be understood from FIGS. 12F, 12G, 13F and 13G that "1" can be written by causing the write current $I_{WL}$ to flow initially and "0" can be written by causing the write current $I_{BL}$ to flow initially regardless of a state of "1" or "0" in the magneto-resistance element.

Accordingly, at the time of manufacturing the MRAM, for example, the write current $I_{WL}$ may be made to flow initially through a word line into which "0" should be written, and the write current $I_{BL}$ may be made to flow initially through a bit line into which "1" should be written, in a state that the memory cells are aligned in the clockwise direction system. According to this operation, it is not necessary to perform the read operation in advance and determine whether or not to write data as required in a toggle MRAM of a conventional technique. Therefore, a speed to write can be improved.

Data is written into the memory cell 10 as follows. The stacked ferric free layer 1 of the memory cell 10 has layers entirely unified to the clockwise direction system or the counterclockwise direction system. A suffix s means to be selected.

With respect to the magneto-resistance element 5 of the selected cell 10s at an intersection between the selected write word line 26s selected by the X-side selector 38 and the selected bit line 27s selected by the Y-side selector, either one of the write current $I_{BL}$ and the write current $I_{WL}$ is made to flow initially in accordance with data to write (either "1" or "0"), followed by causing the remaining one to flow after a predetermined time interval. Thereafter, the current which was made to flow first is stopped, and then the current which was made to flow later is stopped. Details of the above operation are as indicated in FIGS. 12A to 12G or FIGS. 13A to 13G. Therefore, a magnetization direction of the stacked ferric free layer 1 of the magneto-resistance element 5 is maintained or rotated so as to correspond to data to write (either "1" or "0"), and the data is written.

According to the present invention, "1" and "0" can be written without performing the read operation while maintaining characteristics of a toggle MRAM in which a multiple write is hardly generated. Therefore, a speed to read can be improved. Accordingly, it is possible to realize a magneto-resistance element and a magnetic random access memory that exhibit a higher performance.

In the above stacked ferric free layer 1 of the above-described magneto-resistance element, in case of having small anisotropy energy of the magnetization moment of the second layer in comparison with anisotropy energy in the ferromagnetic layer 11 (first layer) and anisotropy energy in the ferromagnetic layer 13 (third layer). However, if the second layer has large anisotropy energy and large energy obtained by directing a magnetization direction thereof to a direction of the magnetic field, the chirality is changed in a magnetic field equal to or less than the flop magnetic field. An operation in the above case is shown in FIGS. 14A to 14D.

Figure 14:
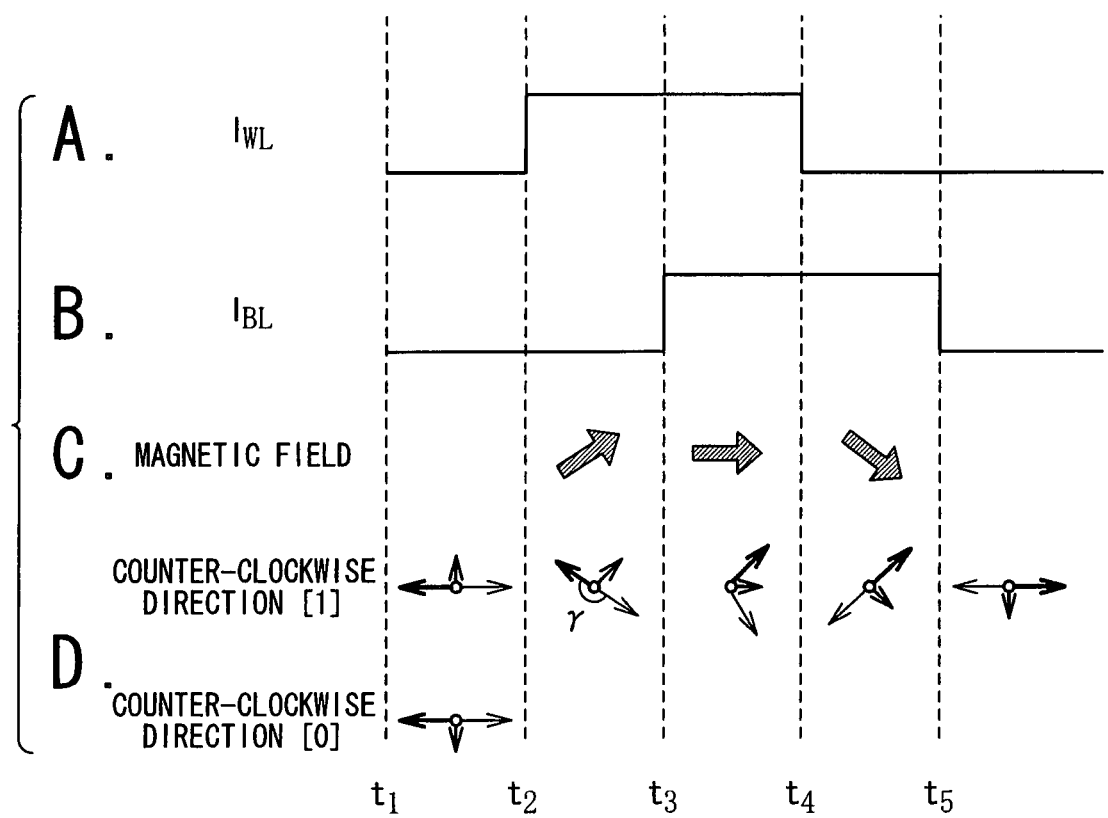
FIGS. 14A to 14D are diagrams showing a change in a magnetization direction of each of the layers in the stacked ferric free layer.

FIGS. 14A to 14D are diagrams showing a change in a magnetization direction of each of the layers in the stacked ferric free layer. FIG. 14A is a timing chart of the write current $I_{WL}$ flowing through the word line 26. FIG. 14B is a timing chart of the write current $I_{BL}$ flowing through the bit line 27. FIG. 14C is a time change in a direction of the magnetic field generated by the write current $I_{BL}$ and the write current $I_{WL}$. FIG. 14D indicates a change in the magnetization directions of the first layer through the third layer in case of storing "1" in the stacked ferric free layer of the clockwise direction system (left side in FIG. 9) and the counterclockwise direction system (left side in FIG. 10) that store "1". In FIG. 14D, a thick arrow indicates a magnetization direction of the first layer (ferromagnetic layer 11), a medium arrow indicates a magnetization direction of the second layer (ferromagnetic layer 12), and a thin arrow indicates a magnetization direction of the third layer (ferromagnetic layer 13). As shown in FIGS. 14A and 14B, there is shown a case in which the write current $I_{WL}$ is made to flow initially.

Referring to FIG. 14D, if the magnetic field is applied in a direction at 45 degrees (in an upper direction of FIG. 14D) (time: t2 to t3), a magnetization direction of the second layer is directed to the magnetic field in both the clockwise direction system of "1" and the counterclockwise direction system of "1". An angle between the second layer and the first layer and an angle between the second layer and the third layer are made wide. An operation is the same as that of a general toggle cell, in which "1" and "0" cannot be selectively written. Accordingly, it is necessary in the stacked ferric free layer 1 to have small anisotropy energy in the second layer in comparison with anisotropy energy in the first layer and anisotropy energy in the third layer.

Figure 15:
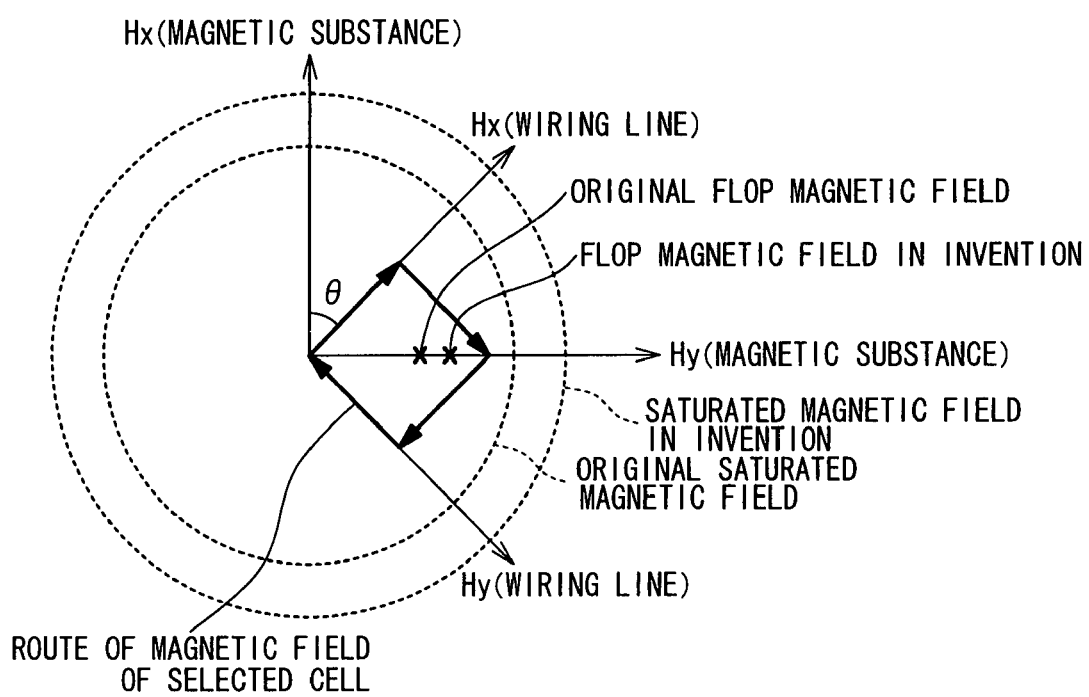
FIG. 15 is a graph showing a relationship between a flop magnetic field and a saturated magnetic field in the stacked ferric free layer of the magneto-resistance element according to the present invention.

FIG. 15 is a graph showing a relationship between the flop magnetic field and a saturated magnetic field in the stacked ferric free layer of the magneto-resistance element according to the present invention. The magneto-resistance element 5 is inclined to the Y axis by θ. Therefore, the magnetic fields HX (magnetic substance) and HY (magnetic substance) of the magneto-resistance element in the magnetization hard axial direction and the magnetization easy axial direction are inclined to the magnetic fields HX (wiring) and HY (wiring) of the wirings in the X axial direction and the Y axial direction by θ.

The stacked ferric free layer 1 in the magneto-resistance element according to the present invention has an influence of the second layer which is increased in accordance with the decrease of an angle between the first layer and the third layer. Therefore, between a ratio of the increase in a flop magnetic layer caused by an influence of the second layer and a ratio of the increase in the saturated magnetic field caused by an influence of the second layer, the latter is greater. Accordingly, an interval between the flop magnetic field and the saturated magnetic field is made wide, and a margin relative to the thermal disturbance can be increased. It will be described by using FIG. 18.

FIGS. 18A to 18C are diagrams showing a relationship between a magnetization direction and energy among the first layer, the second layer, and the third layer. An upper side indicates the clockwise direction system and a lower side indicates the counterclockwise direction system, showing a state that the clockwise direction system and the counterclockwise direction system have a same angle between magnetization of the first layer and magnetization of the third layer. FIG. 18A shows a case that a magnetic field applied to the stacked ferric free layer 1 is "0", FIG. 18B shows a case that the magnetic field applied to the stacked ferric free layer 1 is close to the flop magnetic field, and FIG. 18C shows a case that the magnetic field applied to the stacked ferric free layer 1 is the saturated magnetic field. In FIG. 18A, the first layer and the third layer have an orthogonal magnetization direction to the second layer regardless of a magnetization direction of the second layer, having the same energy among the layers. That is, a magnetization direction of the second layer has no influences in terms of energy. In FIG. 18B, the first layer and the third layer have a magnetization direction which is slightly deviated from being orthogonal to that of the second layer, so that there is an influence caused by a magnetization direction of the second layer in terms of energy. However, the influence is not as large as a saturated state in FIG. 18C. In FIG. 18C, a magnetization direction of the second layer is made to be parallel or antiparallel to the magnetization directions of the first layer and the third layer. Therefore, a magnetization direction of the second layer has a large influence in terms of energy. That is, the magnetic field in the vicinity of the flop magnetic field has energy which is not sensitive to a magnetization direction of the second layer in comparison with a magnetic flied with saturated magnetization in the first layer and the third layer.

According to the present invention, the write magnetic field allows to prevent the composite magnetization from approaching saturation and to suppress a possibility of switching between the magnetization of the ferromagnetic layer in the upper layer and the magnetization of the ferromagnetic layer in the lower layer due to the thermal disturbance. As a result, it is possible to manufacture a magneto-resistance element and a magnetic random access memory with the higher reliability and higher yields. Therefore, a magneto-resistance element and the magnetic random access memory can be realized further inexpensively.

The above-described stacked ferric free layer 1 has a configuration including the ferromagnetic layer (first layer) 11, the non-magnetic layer 21, the ferromagnetic layer (second layer) 12, the non-magnetic layer 22, and the ferromagnetic layer (third layer) 13 as shown in FIG. 8. However, it may have a configuration as shown in FIG. 15.

Figure 16:
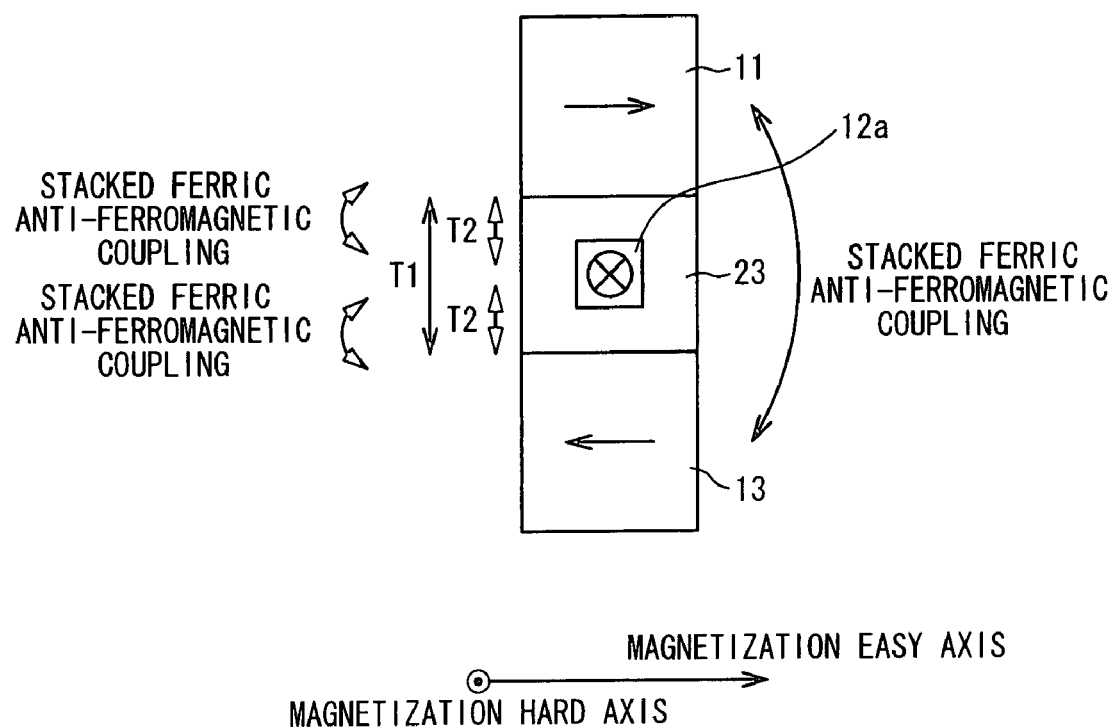
FIG. 16 is a cross-sectional view showing a modified example of the stacked ferric free layer of the memory cell.

FIG. 16 is a cross-sectional view showing a modified example of the stacked ferric free layer 1 of the memory cell. The stacked ferric free layer 1 is a stacked ferrimagnetic structure. The stacked ferrimagnetic structure includes the 3-layer ferromagnetic layers 11, 12a and 13, including a non-magnetic intermediate layer 23 which is disposed so as to surround the second layer (ferromagnetic layer 12a) between the first layer (ferromagnetic layer 11) and the third layer (ferromagnetic layer 13). As a result, the first layer and the third layer are coupled through the non-magnetic layer, and the anti-ferromagnetic coupling can also be realized between the first layer and the third layer. A film thickness T2 of the non-magnetic intermediate layer 23 between the ferromagnetic layer 11 and the ferromagnetic layer 12a is determined to anti-ferromagnetically couple or allow the anti-ferromagnetic coupling of the ferromagnetic layer 11 and the ferromagnetic layer 12a by the non-magnetic layer 23. Similarly, the film thickness T2 of the non-magnetic intermediate layer 23 between the ferromagnetic layer 13 and the ferromagnetic layer 12a is determined to anti-ferromagnetically couple or allow the anti-ferromagnetic coupling of the ferromagnetic layer 13 and the ferromagnetic layer 12a by the non-magnetic layer 23. Furthermore, a film thickness of the non-magnetic intermediate layer 23 between the ferromagnetic layer 11 and the ferromagnetic layer 13 is determined to anti-ferromagnetically couple or allow the anti-ferromagnetic coupling of the ferromagnetic layer 11 and the ferromagnetic layer 13 by the non-magnetic layer 23.

Figure 17:
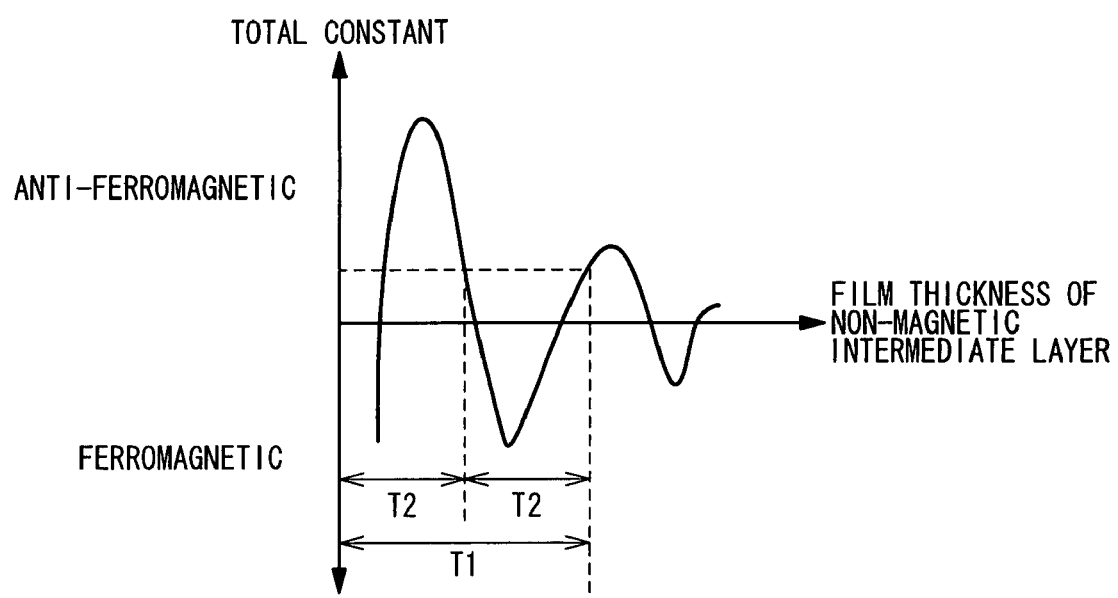
FIG. 17 is a graph showing a relationship between a mutual coupling coefficient among ferromagnetic layers and a nonmagnetic intermediate layer.

FIG. 17 is a graph showing a relationship between a mutual coupling coefficient among the ferromagnetic layer 11, the ferromagnetic layer 12a and the ferromagnetic layer 13, and the non-magnetic intermediate layer. A vertical axis indicates a coupling coefficient which is defined to be positive when the ferromagnetic layers are anti-ferromagnetically coupled from each other. A horizontal axis indicates a film thickness of the non-magnetic intermediate layer 23. The coupling coefficient vibrates while attenuating between a ferromagnetic state and an anti-ferromagnetic state due to a film thickness of the non-magnetic intermediate layer 23. As shown in FIG. 17, if a distance among the ferromagnetic layer 11, the ferromagnetic layer 12a and the ferromagnetic layer 13 or the film thicknesses T1 and T2 of the non-magnetic intermediate 23 are appropriately maintained, the anti-ferromagnetic coupling can be obtained in entire states between the ferromagnetic layer 11 and the ferromagnetic layer 12a, between the ferromagnetic layer 11 and the ferromagnetic layer 13, and between the ferromagnetic layer 12a and the ferromagnetic layer 13. As described above, the film thicknesses T1 and T2 is controlled to allow a flexible control of a coupling strength in comparison with the case of FIG. 8.

In this case, the first coupling, the second coupling and the third coupling are intended to realize a different state from each other, and the couplings are mutually competitive. The first coupling (the anti-ferromagnetic coupling) between the ferromagnetic layer 11 and the ferromagnetic layer 12a and the second coupling (the anti-ferromagnetic coupling) between the ferromagnetic layer 12a and the ferromagnetic layer 13 are stabilized by coupling the respective magnetization directions in an antiparallel state. Therefore, the magnetization directions of the ferromagnetic layer 11 and the ferromagnetic layer 13 are directed in the same direction for stabilization. Meanwhile, the third coupling (the anti-ferromagnetic coupling) between the ferromagnetic layer 11 and the ferromagnetic layer 13 is stabilized by coupling the magnetization directions of the ferromagnetic layer 11 and the ferromagnetic layer 13 in an antiparallel state. Due to this competition, "1" and "0" can be selectively written in the toggle operation without performing the read operation.

According to the present invention, versatility in designing a magneto-resistance element can be further improved. It is therefore possible to acquire the higher performance and a higher reliability.

The present invention is not limited to each of the above cases, and it is apparent that the above cases can be appropriately modified within a scope of technical ideas of the present invention.

According to the present invention, "1" and "0" can be selectively written while eliminating a multiple write. The write magnetic field allows to prevent the composite magnetization from approaching saturation and to suppress a possibility of switching between the magnetization of the ferromagnetic layer in the upper layer and the magnetization of the ferromagnetic layer in the lower layer due to the thermal disturbance.

The invention claimed is:

1. A magneto-resistance element comprising:
   a free layer;
   a fixed layer; and
   a non-magnetic layer interposed between said free layer and said fixed layer,
   wherein said free layer comprises:
   a first magnetic layer;
   a second magnetic layer;
   a third magnetic layer;
   a first non-magnetic layer interposed between said first magnetic layer and said second magnetic layer; and
   a second non-magnetic layer interposed between said second magnetic layer and said third magnetic layer,
   said first magnetic layer, said second magnetic layer and said third magnetic layer are coupled such that spontaneous magnetizations have a helical structure.

2. The magneto-resistance element according to claim 1, wherein an angle between a first direction of said spontaneous magnetizations of said first magnetic layer and a second direction of said spontaneous magnetization of said second magnetic layer is substantially a right angle, and
   an angle between the first direction and a third direction of said spontaneous magnetization of said third magnetic layer is substantially two right angles.

3. The magneto-resistance element according to claim 1, wherein a first coupling between said first magnetic layer and said second magnetic layer and a second coupling between said second magnetic layer and said third magnetic layer are competitive with a third coupling between said first magnetic layer and said third magnetic layer.

4. The magneto-resistance element according to claim 3, wherein said first coupling and said second coupling are an anti-ferromagnetic coupling through said non-magnetic layers, and the third coupling is the anti-ferromagnetic coupling by magneto-static energy.

5. The magneto-resistance element according to claim 3, wherein said first non-magnetic layer and said second non-magnetic layer are coupled on a side surface of said second magnetic layer to form a third non-magnetic layer, and
   said first coupling and said second coupling are an anti-ferromagnetic coupling through said non-magnetic layers, and said third coupling is an anti-ferromagnetic coupling through said non-magnetic layer.

6. The magneto-resistance element according to claim 3, wherein said free layer has small anisotropy energy of a magnetization moment in said second magnetic layer, compared with anisotropy energy of a magnetization moment in said first magnetic layer and anisotropy energy of a magnetization moment in said third magnetic layer.

7. A magnetic random access memory comprising:
   a plurality of first wirings extending in a first direction;
   a plurality of second wirings extending in a second direction which is substantially orthogonal to said first direction; and
   a plurality of memory cells arranged at intersections of said plurality of first wirings and said plurality of second wirings,
   wherein each of said plurality of memory cells comprises a magneto-resistance element, said magneto-resistance element comprises:
a free layer;
a fixed layer; and
a non-magnetic layer interposed between said free layer and said fixed layer,
said free layer comprises:
a first magnetic layer;
a second magnetic layer;
a third magnetic layer;
a first non-magnetic layer interposed between said first magnetic layer and said second magnetic layer; and
a second non-magnetic layer interposed between said second magnetic layer and said third magnetic layer,
said first magnetic layer, said second magnetic layer, and said third magnetic layer are coupled such that spontaneous magnetizations have a helical structure, and
said magneto-resistance element has a magnetization easy axis whose direction is different from said first direction and said second direction.

8. The magnetic random access memory according to claim 7, wherein an angle between said magnetization easy axis direction and said first direction is substantially 45 degrees.

9. The magnetic random access memory according to claim 7, wherein in a selected cell as the memory cell at an intersection of one selected from said plurality of first wirings and one selected from said plurality of second wirings, a write operation be performed by supplying a first write current to a first current wiring as the selected first wiring based on memory data to be written, and then supplying a second write current to a second current wiring as the selected second wiring, next by stopping said first write current and then stopping the second write current.

10. The magnetic random access memory according to claim 7, wherein in a selected cell as the memory cell at an intersection of one selected from said plurality of first wirings and one selected from said plurality of second wirings, a write operation be performed by supplying a first write current to a first current wiring as the selected second wiring based on memory data to be written, and then supplying a second write current to a second current wiring as the selected first wiring, and next by stopping the first write current and then stopping the second write current.

11. A magnetic random access memory comprising:
a first wiring extending in a first direction;
a second wiring extending in a second direction which is substantially orthogonal to said first wiring;
a memory cell provided between said first wiring and said second wiring at an intersection of said first wiring and said second wiring to have a magneto-resistance element; and
a current supply unit configured to supply currents to said first wiring and said second wiring, respectively,
wherein said magneto-resistance element comprises:
a free layer;
a fixed layer; and
a non-magnetic layer interposed between said free layer and said fixed layer,
said free layer comprises:
a first magnetic layer;
a second magnetic layer;
a third magnetic layer;
a first non-magnetic layer interposed between said first magnetic layer and said second magnetic layer; and
a second non-magnetic layer interposed between said second magnetic layer and said third magnetic layer,
said first magnetic layer, said second magnetic layer, and said third magnetic layer are coupled such that spontaneous magnetizations have a helical structure,
in response to data to be written in said memory cell, said current supply unit starts to supply a first current to one of said first wiring and said second wiring, and then starts to supply a second current to the remaining wiring of the first wiring and the second wiring while the first current is being supplied, next stops the first current while the second current is being supplied, and then stops the second current after the first current is stopped.

12. The magnetic random access memory according to claim 11, wherein said magneto-resistance element has a magnetization easy axis whose direction is different from said first direction and said second direction, and an angle between the magnetization easy axis direction and said first direction is substantially 45 degrees.

13. The magnetic random access memory according to claim 11, wherein an angle between a first magnetization direction of said spontaneous magnetization of said first magnetic layer and a second magnetization direction of said spontaneous magnetization of said second magnetic layer is substantially a right angle, and an angle between said first magnetization direction and a third magnetization direction of said spontaneous magnetization of said third magnetic layer is substantially two right angles.

14. The magnetic random access memory according to claim 11, wherein a first coupling between said first magnetic layer and said second magnetic layer and a second coupling between said second magnetic layer and said third magnetic layer are competitive with a third coupling between said first magnetic layer and said third magnetic layer.

15. The magnetic random access memory according to claim 14, wherein said first coupling and said second coupling are anti-ferromagnetic coupling through said non-magnetic layers, and said third coupling is anti-ferromagnetic coupling by magneto-static energy.

16. The magnetic random access memory according to claim 14, wherein said first non-magnetic layer and said second non-magnetic layer are coupled on a side surface of said second magnetic layer to form a third non-magnetic layer,
said first coupling and said second coupling are anti-ferromagnetic coupling through said non-magnetic layers, and said third coupling is an anti-ferromagnetic coupling through said non-magnetic layer.

17. The magnetic random access memory according to claim 14, wherein said free layer has small anisotropy energy of a magnetization moment of said second magnetic layer, compared with anisotropy energy of a magnetization moment of said first magnetic layer and anisotropy energy of a magnetization moment of said third magnetic layer.

18. A magnetic random access memory comprising:
a first wiring extending in a first direction;
a second wiring extending in a second direction which is substantially orthogonal to said first wiring;
a memory cell provided between said first wiring and said second wiring at an intersection of said first wiring and said second wiring to have a magneto-resistance element; and
a magnetic field applying unit configured to apply a rotational magnetic field to said memory cell by supplying currents to said first wiring and said second wiring,
wherein said magneto-resistance element comprises:
a free layer;
a fixed layer; and a non-magnetic layer interposed between said fixed layer and said free layer, said free layer comprises:

a first magnetic layer having a spontaneous magnetization in a third direction;

a second magnetic layer having a spontaneous magnetization in a direction orthogonal to said third direction and magnetically coupled with said first magnetic layer; and a third magnetic layer having a spontaneous magnetization in a direction opposite to said third direction and magnetically coupled with said first and second magnetic layers, said magnetic field applying unit applies one of a magnetic field rotated in a clockwise direction and a magnetic field rotated in a counterclockwise direction as said rotational magnetic field to said memory cell based on data to be written into said memory cell.

19. The magnetic random access memory according to claim 18, wherein said magneto-resistance element has a magnetization easy axis whose direction is different from said first direction and said second direction, and an angle between said magnetization easy axis direction and said first direction is substantially 45 degrees.

* * * * *